(12) United States Patent
Koyama et al.

US007667273B2

(10) Patent No.: US 7,667,273 B2
(45) Date of Patent: Feb. 23, 2010

(54) SEMICONDUCTOR DEVICE AND METHOD FOR MANUFACTURING THE SAME

(75) Inventors: Masato Koyama, Kanagawa-Ken (JP); Yoshinori Tsuchiya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/679,417

(22) Filed: Feb. 27, 2007

(65) Prior Publication Data

US 2007/0278558 A1    Dec. 6, 2007

(30) Foreign Application Priority Data

Jun. 5, 2006    (JP)    ............... 2006-156422

(51) Int. Cl.
*H01L 23/62*    (2006.01)
(52) U.S. Cl. ............... 257/369; 257/E21.064
(58) Field of Classification Search ......... 257/151–153, 257/249, 314–320, 331, 366, 387, 412, 369, 257/E21.064
See application file for complete search history.

(56) References Cited

U.S. PATENT DOCUMENTS 6,750,503 B2 *  6/2004  Ohnishi et al. ............... 257/315
6,869,867 B2 *  3/2005  Miyashita et al. ........... 438/586

FOREIGN PATENT DOCUMENTS

JP    2005-136198    5/2005

OTHER PUBLICATIONS

U.S. Appl. No. 12/133,583, filed Jun. 5, 2008, Koyama, et al.
Chih Feng Huang, et al., "Analysis of NiSi Fully-silicided Gate on $SIO_2$ and $HfO_2$ for CMOS Application", Extended Abstracts of the 2005 International Conference on Solid State Devices and Materials, Sep. 13-15, 2005, pp. 506-507 and two cover pages.
Kensuke Takahashi, et al., "Dual Workfunction Ni-Silicide/HfSiON Gate Stacks by Phase-Controlled Full-Silicidation (PC-FUSI) Technique for 45nm-node LSTP and LOP Devices", 2004 International Electron Devices Meeting, Technical Digest, IEEE, Dec. 13-15, 2004, pp. 91-94 and two cover pages.

(Continued)

*Primary Examiner*—Bradley K Smith
*Assistant Examiner*—Amar Movva
(74) *Attorney, Agent, or Firm*—Oblon, Spivak, McClelland, Maier & Neustadt, L.L.P.

(57) ABSTRACT

A semiconductor device includes a p-channel MIS transistor. A p-channel MIS transistor includes; an n-type semiconductor layer formed on the substrate; first source/drain regions being formed in the n-type semiconductor layer and being separated from each other; a first gate insulating film being formed on the n-type semiconductor layer between the first source/drain regions, and containing silicon, oxygen, and nitrogen, or containing silicon and nitrogen; a first gate electrode formed above the first gate insulating film; and a first interfacial layer being formed at an interface between the first gate insulating film and the first gate electrode, and containing a 13-group element. The total number of metallic bonds in the 13-group element in the interfacial layer being larger than the total number of each of oxidized, nitrided, or oxynitrided bonds in the 13-group element in the interfacial layer.

10 Claims, 29 Drawing Sheets

OTHER PUBLICATIONS

Yoshinori Tsuchiya, et al., "Physical Mechanism of Work Function Modulation due to Impurity Pileup at Ni-FUSI/SiO(N) Interface", 2005 International Electron Devices Meeting, Technical Digest, IEEE, Dec. 5-7, 2005, pp. 637-640 and two cover pages.

* cited by examiner

A-A CROSS-SECTION

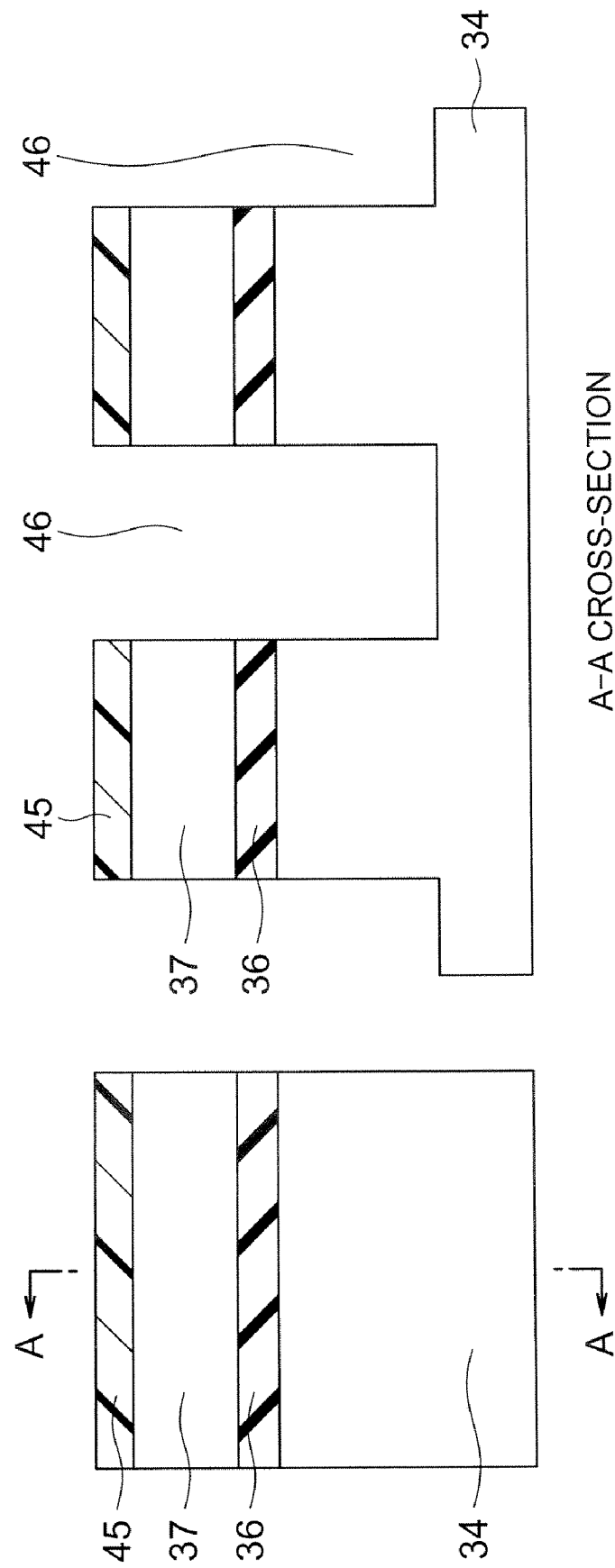

A-A CROSS-SECTION

A-A CROSS-SECTION

A-A CROSS-SECTION

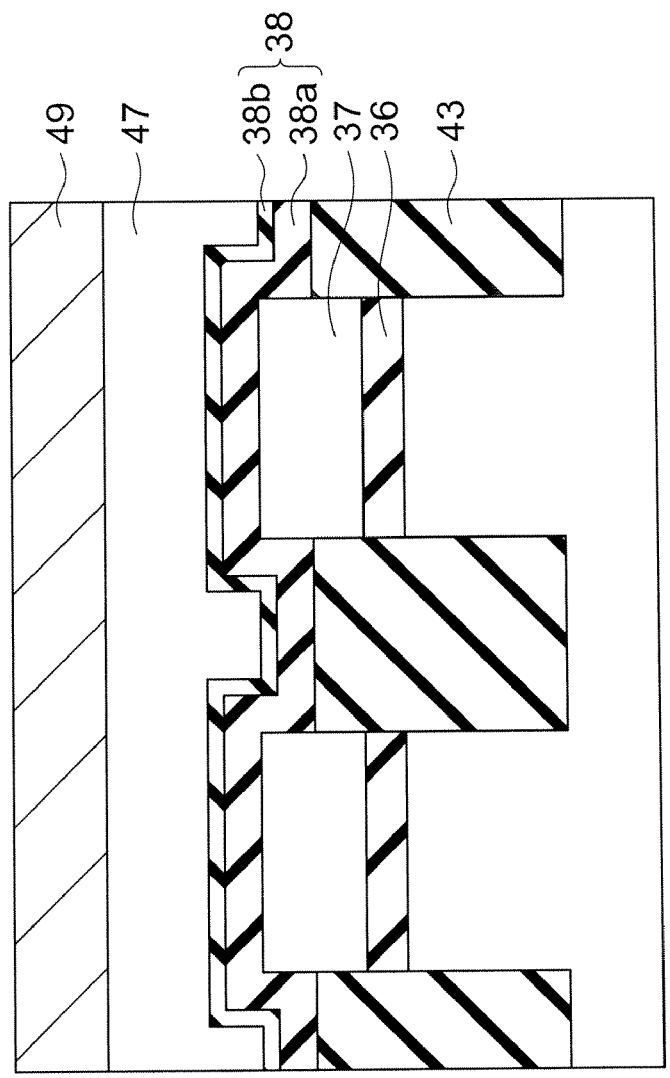
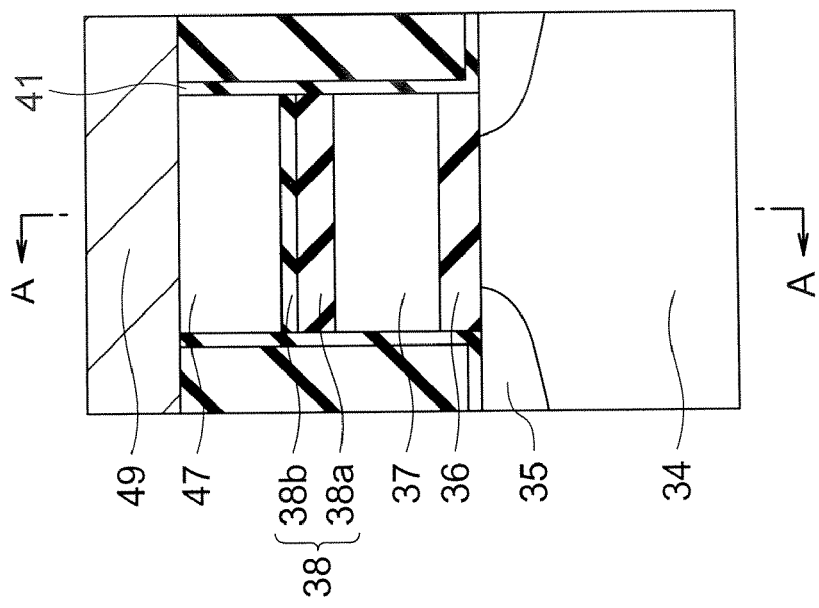
FIG. 36A
FIG. 36B  A-A CROSS-SECTION

A-A CROSS-SECTION

| SILICIDE PHASE | Ni/Si | WORK FUNCTION (eV) |
| --- | --- | --- |
| $NiSi_2$ | 0.5 | 4.55 |
| NiSi | 1 | 4.65 |
| $Ni_2Si$ | 2 | 4.75 |
| $Ni_{31}Si_{12}$ | 2.58 | 4.85 |
| $Ni_3Si$ | 3 | 4.85 |

FIG. 38

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2006-156422 filed on Jun. 5, 2006 in Japan, the entire contents of which are incorporated herein by reference.

BACKGROUND OF THE INVENTION

1. Field of the Invention

The present invention relates to a semiconductor device having field effect transistors, and a method for manufacturing the semiconductor device.

2. Related Art

"Silicon large-scale integrated circuit" is one of the fundamental device technologies that will support the advanced information society in the future. High performances through highly advanced features, high-speed operations, low power consumptions, and the likes, have been realized with minute semiconductor devices such as CMOS (Complementary Metal Oxide Semiconductor) logic devices and flash memories. In recent years, however, it has been difficult to attain high performances with minute devices, due to various physical limitations.

With the conventional gate electrodes formed with silicon in CMOS logic devices, there have been such problems as the increasing gate parasitic resistance observed with the higher device operation speed, the decreases of the effective capacitances of insulating films due to the carrier depletion at the interfaces with the insulating films, and the variations in threshold voltage due to the added impurities spreading into the channel regions. To solve those problems, a metal gate technique has been developed. By the metal gate technique, the conventionally employed silicon is replaced with a heat-resistant metal material, so as to collectively solve the problems such as the increasing gate parasitic resistance, the capacitance decreases due to depletion, and the spread of impurities. However, the metal gate technique causes great concern about the complicated device manufacturing process.

To eliminate such concern, a full-silicidation technique (hereinafter referred to also as the FUSI (Fully Silicided Gate) technique) has been developed. By the full-silicidation technique, a CMOS transistor is formed by a conventional silicon gate technique, and the silicon gate is then chemically reacted with a metal (silicidation). As a result, the silicon gate is turned into a silicide, and thus a metal gate is obtained. This technique has a tremendous application, because a metal gate can be formed while the gate processing and post oxidization can be performed by the conventional silicon gate technique.

The advantage of the FUSI technique is that the effective work function of a silicide can be modulated by controlling the type and amount of the impurity element to be added to the silicon gate prior to silicidation. When silicidation is performed, the impurities added to the silicon gate are segregated at the interface between the gate insulating film made of $SiO_2$ and the silicide, due to a so-called "snow-plowing effect". The original work function of the silicide material is modulated by the effect of the segregated impurities. More specifically, in a case of a p-channel MIS transistor, the work function of the silicide is increased by a material such as boron or aluminum segregated at the interface. In a case of an n-channel MIS transistor, the work function of the silicide is reduced by a material such as phosphorus, arsenic, or antimony segregated at the interface. Accordingly, the threshold voltages (Vth) of both transistors can be readily set at desired values.

Meanwhile, as for the gate insulating film, it is necessary to introduce a high-k material having a high dielectric constant, so as to restrain an increase in device power consumption due to an increase in leakage current. It has been believed that a combination of the FUSI technique and a high-k material is inevitable in future products, and provides CMOS logic devices of higher performance. In reality, however, the flat band voltage Vfb of a silicide/high-k material behaves very differently from that of a conventional gate insulating film, because of the specific properties of the interface between a silicide and a high-k material. As a result, there has been a report that controlling the threshold voltages Vth of a MOS transistor becomes very difficult (see K. Takahashi et al., "Dual Work Function Ni-Silicide/HfSiON Gate Stacks by Phase-Controlled Full-Silicidation (PC-FUSI) Technique for 45 nm-node LSTP and LOP Devices", p.p. 91-94, IEDM, (2004) (hereinafter referred to as Document 1)). When the material of an insulating film is switched from $SiO_2$ to a high-k material, the apparent work function of the silicide decreases, and the effect of work function modulation by the impurities is lost.

A CMOS logic device of higher performance cannot be formed with a FUSI/high-k combination, unless the problem of the difficulty in controlling the threshold voltages Vth is solved. There has been a report that an $SiO_2$ layer provided at the interface between a silicide and an insulating film made of a high-k material can correct an abnormal shift of the flat band voltage Vfb. According to this report, $HfO_2$ is used as the material of a high-k film, and nickel silicide (NiSi) is used as a silicide. However, the work function of NiSi also decreases as in the case of $SiO_2$, and the effect of work function modulation by impurities such as phosphorus and boron is substantially lost, as mentioned in Document 1. As a result, it becomes difficult to obtain desired threshold voltages Vth.

Meanwhile, there has also been a report that increases in work function can be obtained as in the case where the gate insulating film is made of $SiO_2$. According to this report, a $SiO_2$ layer of 1.1 nm in thickness is provided at the interface between NiSi and $HfO_2$, and silicidation is performed after $BF_2$ ions are implanted into the silicon gate (see C. F. Huang and B. Y. Tsui, "Analysis of NiSi Fully-Silicided Gate on $SiO_2$ and $HfO_2$ for CMOS Application", p.p. 506-507, SSDM, (2005) (hereinafter referred to as Document 2)). However, the reason that such an effect can be achieved is not discussed in Document 2.

Document 2 discloses a structure in which a material such as $SiO_2$ having a low dielectric constant is stacked together with a high-k film. Such a structure disclosed in Document 2 is not very suitable for practical use, since the capacitance of the gate insulating film is severely reduced, leading to the inhibition of high-speed operations of a CMOS logic device.

Meanwhile, to form a high-functioning stack-type memory cell (substrate/tunnel insulating film/floating gate electrode/interelectrode insulating film/control gate electrode, for example) to be used for a flash memory or the like, it is effective to change the control gate electrode from the conventional $n^+$-polysilicon to a metal gate. By doing so, the depletion layer in the silicon gate disappears, and the voltage drop caused in the depletion layer can be ignored. Accordingly, the voltage of the control gate electrode can be effectively used by performing charge writing/erasing in the floating gate electrode. More specifically, the memory window width of the threshold voltage Vth becomes larger, and a multi-value operation can be easily performed.

As in a case of a CMOS logic device, the control gate electrode is preferably formed with a material that exhibits high compatibility with the conventional LSI process. Therefore, a stack-type memory cell is formed by the conventional polysilicon gate technique, and the polysilicon in the control gate is silicided in the back-end process according to the FUSI technique, which is now a preferred technique.

Another request with respect to the properties of the control gate electrode is a largest possible work function. If the work function is maximized, the leakage current in the interelectrode insulating film at the time of writing can be reduced, and accordingly, the Vth memory window can be made larger.

As for the interelectrode insulating film, on the other hand, there has been a request for greater electric coupling between the control gate electrode and the floating gate electrode while the leakage current is maintained low. This request can be satisfied by employing a high-k material. Particularly, as the miniaturization of memory cells will reach the limit in the near future, the change in cell shape from a three-dimensional one to a flat one is inevitable. In a flat-type memory cell, the capacitance of the interelectrode insulating film can be most effectively increased by polarization in the insulating film. The use of a high-k material for the interelectrode insulating film is inevitable in this technical trend.

As described above, a material having a large work function can be most effectively used as the control gate electrode of a stack-type memory cell, according to the FUSI technique compatible with the conventional LSI manufacturing process. As for the interelectrode insulating film, a high-k material is desirable. However, as in the case of a CMOS logic device, it is not easy to set a large work function for a silicide, due to the specific properties of the interface between the silicide and the high-k film. As already mentioned in the description of the example case with NiSi, the work function of NiSi decreases only because the material of the insulating film is switched from $SiO_2$ to a high-k material. Even if boron or aluminum is segregated at the interface so as to increase the work function, the modulation effect by the impurities is substantially lost due to the specific properties of the interface between NiSi and the high-k film.

SUMMARY OF THE INVENTION

The present invention has been made in view of these circumstances, and an object thereof is to provide a semiconductor device having metal electrodes that are formed on insulating films made of a material with a higher dielectric constant than $SiO_2$ and have the desired work functions, and a method for manufacturing such a semiconductor device.

A semiconductor device according to a first aspect of the present invention includes: a substrate; a p-channel MIS transistor that includes; an n-type semiconductor layer formed on the substrate; first source/drain regions being formed in the n-type semiconductor layer and being separated from each other; a first gate insulating film being formed on the n-type semiconductor layer between the first source/drain regions, and containing silicon, oxygen, and nitrogen, or containing silicon and nitrogen; a first gate electrode formed above the first gate insulating film; and a first interfacial layer being formed at an interface between the first gate insulating film and the first gate electrode, and containing a 13-group element, the total number of metallic bonds in the 13-group element in the interfacial layer being larger than the total number of each of oxidized, nitrided, or oxynitrided bonds in the 13-group element in the interfacial layer; and an n-channel MIS transistor that includes: a p-type semiconductor layer formed on the substrate; second source/drain regions being formed in the p-type semiconductor layer and being separated from each other; a second gate insulating film being formed on the p-type semiconductor layer between the second source/drain regions, and containing silicon, oxygen, and nitrogen, or containing silicon and nitrogen; a second gate electrode formed above the second gate insulating film; and a second interfacial layer being formed at an interface between the second gate insulating film and the second gate electrode, and containing a 15-group element A semiconductor device according to a second aspect of the present invention includes: a semiconductor substrate; and a transistor that includes: source/drain regions being formed in the semiconductor substrate and being separated from each other; a tunnel insulating layer formed on the semiconductor substrate between the source/drain regions; a floating gate electrode formed on the tunnel insulating layer; an interelectrode insulating film including a first insulating layer formed on the floating gate electrode and made of a high-dielectric material; and a second insulating layer being formed on the first insulating layer, and containing silicon, oxygen and nitrogen, or containing silicon and nitrogen; a control gate electrode formed above the interelectrode insulating film; and an interfacial layer being formed at an interface between the second insulating layer and the control gate electrode, and containing a 13-group element, the total number of metallic bonds in the 13-group element in the interfacial layer being larger than the total number of each of oxidized, nitrided, or oxynitrided bonds in the 13-group element in the interfacial layer.

A method for manufacturing a semiconductor device according to a third aspect of the present invention includes: forming a first insulating layer on each semiconductor region of a substrate, the substrate having an n-type semiconductor region and a p-type semiconductor region being insulated from each other, the first insulating layer containing at least silicon and nitrogen; forming a silicon layer on the first insulating layer; processing the first insulating layer and the silicon layer into a gate electrode shape; forming a metal layer on the silicon layer; converting the silicon layer into a metal silicide layer by chemically reacting the silicon layer and the metal layer through a heat treatment; introducing a 13-group element into the metal silicide layer over the n-type semiconductor region, and introducing a 15-group element into the metal silicide layer over the p-type semiconductor region; and segregating at least part of the 13-group element and the 15-group element into a region including an interface between the first insulating layer and the metal silicide layer, by diffusing the 13-group element and the 15-group element through a heat treatment A method for manufacturing a semiconductor device according to a fourth aspect of the present invention includes: forming a tunnel insulating layer on a semiconductor substrate; forming a floating gate electrode layer on the tunnel insulating layer; forming a first insulating layer on the floating gate electrode layer, the first insulating layer being made of a high-dielectric material; forming a second insulating layer on the first insulating layer, the second insulating layer containing at least silicon and nitrogen; forming a silicon layer on the second insulating layer; forming a metal layer on the silicon layer; converting the silicon layer into a metal silicide layer by chemically reacting the silicon layer and the metal layer through a heat treatment; introducing a 13-group element into the metal silicide layer; and segregating at least part of the 13-group element into a region including an interface between the second insulating layer and the metal silicide layer, by diffusing the 13-group element through a heat treatment.

A method for manufacturing a semiconductor device according to a fifth aspect of the present invention includes: forming a first insulating layer on each semiconductor region of a substrate having an n-type semiconductor region and a p-type semiconductor region being insulated from each other, the first insulating layer being made of a high-dielectric material; forming a second insulating layer on the first insulating layer, the second insulating layer containing at least silicon and nitrogen; forming a silicon layer on the second insulating layer; processing the second insulating layer and the silicon layer into a gate electrode shape; forming a first metal layer on the silicon layer over the n-type semiconductor region; forming a buffer layer on the silicon layer over the p-type semiconductor region; forming a second metal layer on the buffer layer over the p-type semiconductor region, the second metal layer containing the same metal as the first metal layer and having a smaller film thickness than the first metal layer; converting the silicon layer into a metal silicide layer by chemically reacting the silicon layer and the first and second metal layers through a heat treatment; introducing a 13-group element into the metal silicide layer over the n-type semiconductor region, and introducing a 15-group element into the metal silicide layer over the p-type semiconductor region; and segregating at least part of the 13-group element and the 15-group element into a region including an interface between the second insulating layer and the metal silicide layer, by diffusing the 13-group element and the 15-group element through a heat treatment.

BRIEF DESCRIPTION OF THE DRAWINGS

FIGS. 29A to 37B illustrate one of the procedures for manufacturing the stack-type memory cells in accordance with the fourth embodiment; and FIG. 38 shows the composition ratios and work functions of the Ni silicides used in the respective embodiments.

DETAILED DESCRIPTION OF THE INVENTION

Figure 1A:
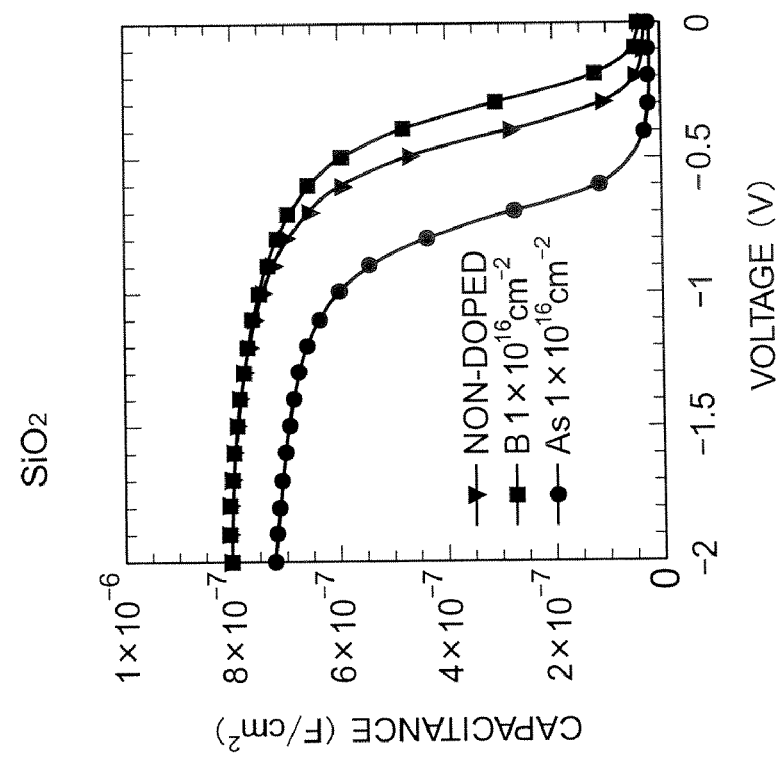
FIGS. 1A and 1B show the result of an experiment that was carried out to explain a work function modulation caused by impurity segregation at the silicide/insulating film interface.

The following is a description of embodiments of the present invention, with reference to the accompanying drawings. Like components are denoted by like reference numerals in the drawings, and explanation of them will not be made more than once in the following. Each of the drawings is a schematic view drawn for ease of explanation, and the shapes, sizes, and rates shown therein might be different from those of actual devices. However, they may be changed or modified, with the following description and the conventional techniques being taken into account.

In each of the following embodiments, CMOS transistors and stack-type memory cells will be described. However, the present invention can be applied to a memory and a logic circuit having the above described semiconductor elements integrated therein, and also to a system LSI having those semiconductor elements mounted on the same chip.

Before the embodiments of the present invention are described, the course of events before the present inventors achieved the present invention will be described below.

As mentioned in the description of the conventional art, the technical problems with a case where a FUSI electrode is formed directly on a high-k film are described in Document 1, for example, and the technical problems with a case where a $SiO_2$ layer as an interface insulating layer is provided between a FUSI electrode and a high-k film so as to avoid the phenomenon specific to the interface between a FUSI electrode and a high-k film are described in Document 2, for example.

In a future LSI, it is highly likely that SiON is used in place of $SiO_2$ as the material of each gate insulating film. This is because a Si(O)N film has a higher dielectric constant than a $SiO_2$ film, and accordingly, a Si(O)N film formed directly on a high-k film does not increase the total thickness of the gate insulating film. In such a structure, the gate capacitance is increased, and the leakage current is reduced. Thus, the performance of a CMOS transistor is not adversely affected.

Taking the above fact into consideration, the inventors carried out experiments to see whether it was possible to produce a semiconductor device that had a FUSI electrode and a high-k film, and effectively modulated the work function of the silicide by virtue of impurities while not reducing the capacitance of the gate insulating film. In this semiconductor device, a SiON film or a SiN film was provided at the interface between the silicie and the high-k film.

Through the experiments, the inventors found that, even though the conventional impurity adding technique using the "snow-plowing effect" was combined with the silicide/Si(O)N/high-k stacking technique, the desired modulation effect on the work function by virtue of impurities could not be achieved. This was particularly clear in a case where impurities for a p-channel MIS transistor, such as boron or aluminum, were used. The reasons are as follows. In a case where the insulating film is made of $SiO_2$, boron or aluminum enters the insulating film while the "snow-plowing effect" develops with silicidation, and there serves as electric dipoles to increase the work function of the silicide. In a case where the insulating film is formed with a film containing nitrogen such as a SiON film or a SiN film, the nitrogen forms a compound with boron or aluminum, and causes electrically active defects. Such defects caused by the nitrogen in the insulating film counteract the electric dipoles, and a desired increase in work function cannot be obtained. The mechanism of the work function modulation by virtue of impurities in a FUSI/$SiO_2$ structure is described by Y. Tsuchiya et al., in "Physical Mechanism of Work Function Modulation due to Impurity Pileup at Ni-FUSI/SiO(N) Interface, p.p. 637-640, IEDM (2005))".

Referring now to FIGS. 1A through 8B, the above phenomenon and its causes are described in greater detail.

Figure 1B:
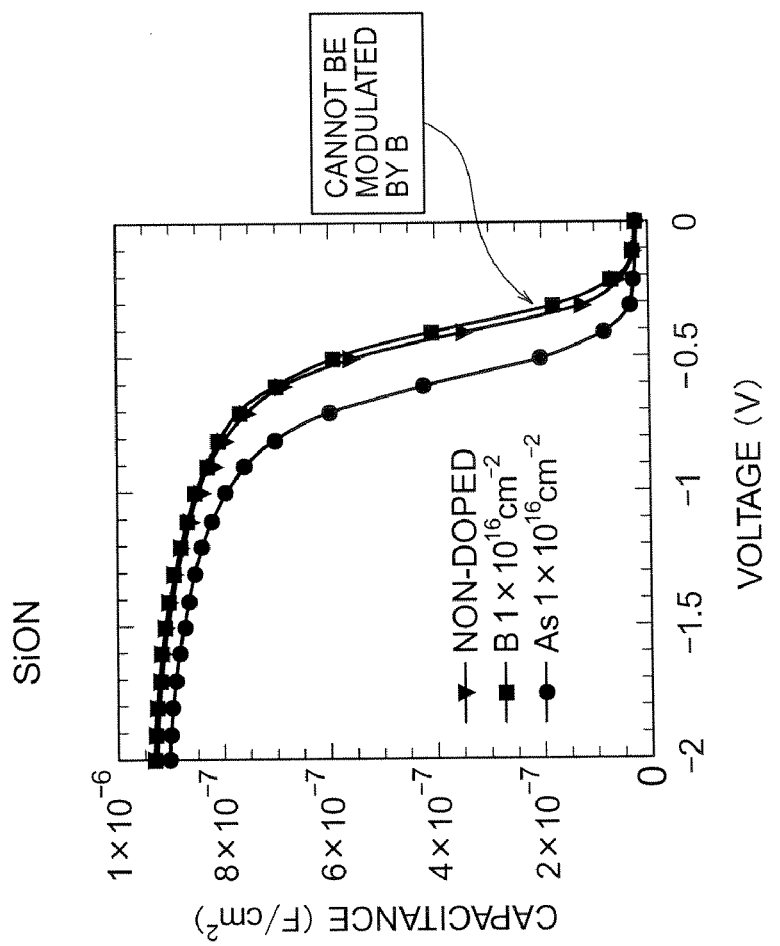

FIGS. 1A and 1B show the results of an experiment that was carried out when the above phenomenon was observed. In FIGS. 1A and 1B, each abscissa axis indicates the voltage applied to the gate electrode, and each ordinate axis indicates the capacitance of the gate insulating film. In this experiment, NiSi was used as the silicide. In a case where the gate insulating film was formed with a $SiO_2$ film, the flat band voltage Vfb shifted in the negative direction when arsenic was added, and shifted in the positive direction when boron was added, compared with a case where no impurities were added to the silicon gate. In FIGS. 1A and 1B, each impurity dose amount is $1\times10^{16}$ atoms/$cm^2$. Such characteristics are disclosed in Documents 1 and 2 (see FIG. 1A). In a case where the gate insulating film is formed with a SiON film, a Vfb shift was observed when arsenic was added, but a Vfb shift was not observed when boron was added (see FIG. 1B).

Figure 2B:
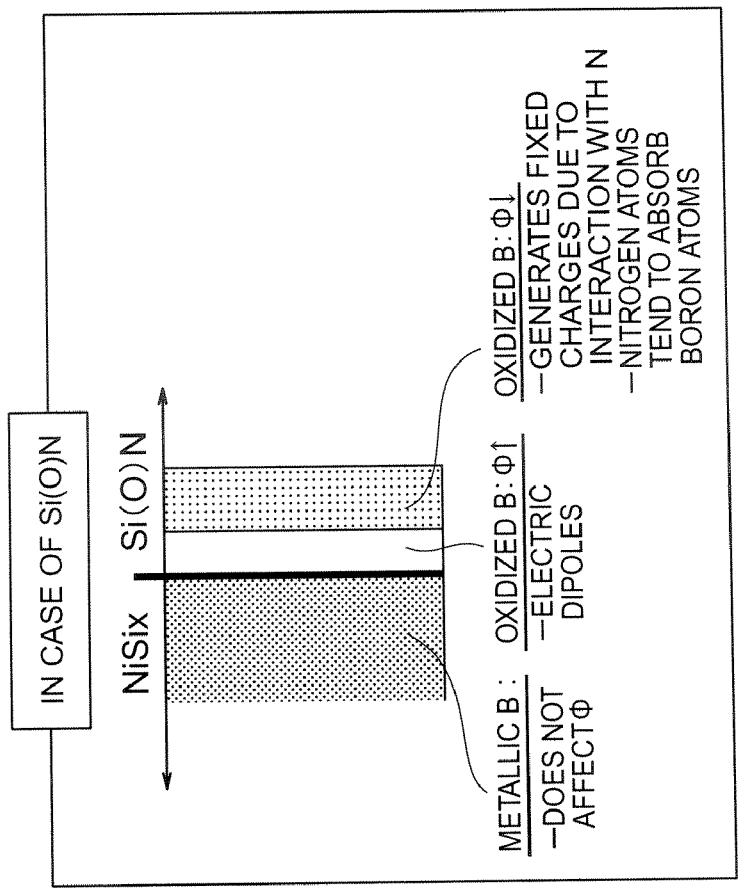
FIGS. 2A and 2B are schematic views showing the impurity distribution and the bonding state of atoms at the silicide/insulating film interface.
Figure 2A:
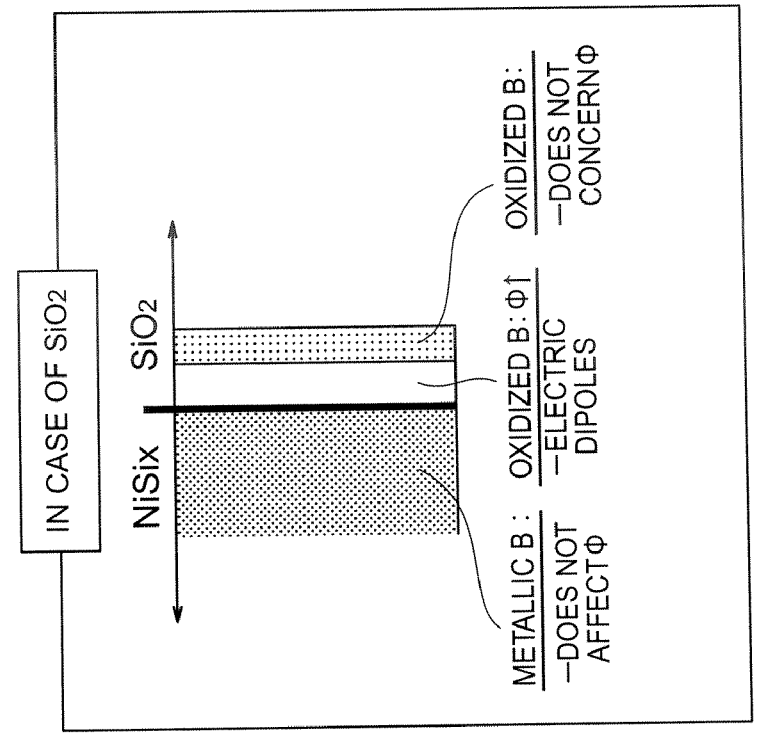

This phenomenon can be explained with the help of the following model case using boron (see FIGS. 2A and 2B). FIGS. 2A and 2B are schematic views showing the impurity distribution and the bonding state of atoms at the silicide/insulating film interface, which complement the explanation of the experiment results showing in FIGS. 1A and 1B. In a case where the gate insulating film is formed with a $SiO_2$ film, the boron segregated at the interface with NiSi and distributed on the side of the NiSi is in a metallic bonding state, while the boron distributed on the side of the $SiO_2$ film is in an oxidized bonding state. Here, a "metallic bonding state" is a situation in which the atoms bonded to one boron atom are of a silicon or a metal such as nickel. An "oxidized bonding state" is a situation in which the atoms bonded to one boron atom are of oxygen. The metallic boron in the metallic bonding state does not affect the work function φ of the NiSi, while the oxidized boron that is in the oxidized bonding state and exists within about 1 nm from the interface generates electric dipoles at the interface, and increases the work function φ of the NiSi. The oxidized boron existing in the $SiO_2$ region that is 1 nm or more apart from the interface does not affect the work function φ at all (see FIG. 2A).

In a case where the gate insulating film is formed with a SiON film, there are no changes in the boron distributed on the side of the NiSi. However, the boron distributed in the gate insulating film is bonded with nitrogen and has a large energy gain. As a result, a larger amount of boron than in the case of a $SiO_2$ film enters the SiON film. Furthermore, the boron bonded to nitrogen serves as positively charged defects, and causes the flat band voltage Vfb to shift in the negative direction (see FIG. 2B). This counteracts the work function increasing effect of the electric dipoles existing near the interface, and the work function φ is not changed by the boron addition at all, as shown in FIG. 1B.

Figure 3:
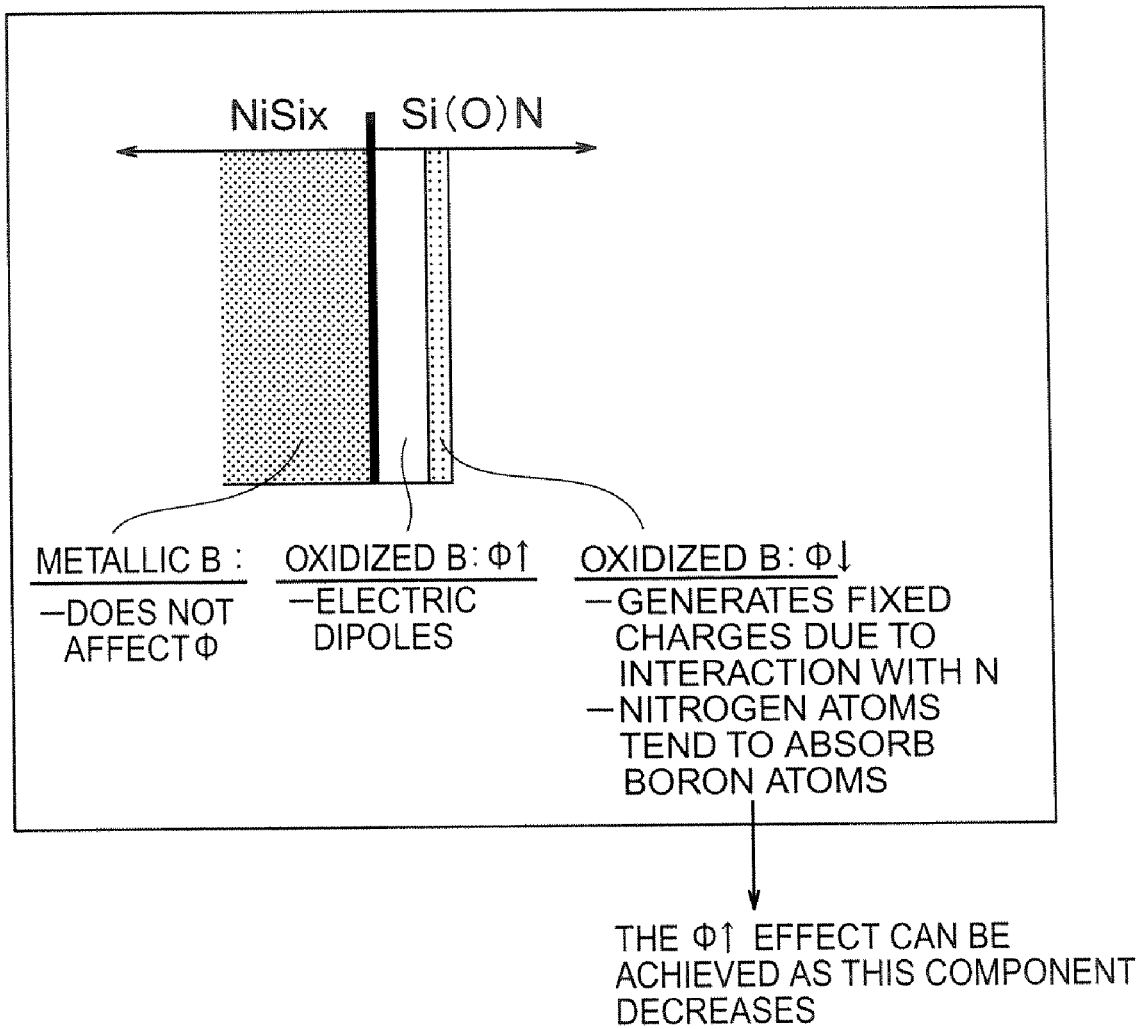
FIG. 3 is a schematic view showing the impurity distribution and the bonding state of atoms at the silicide/insulating film interface.

The newly found fact that the work function cannot be increased by the addition of boron in the case of a SiON film was interpreted by the inventors as described above. Based on this interpretation, the inventors decided that the work function could be modulated as desired, if the bonding state of a segregated object such as boron at the interface between a silicide and a SiON film was controlled in an appropriate manner. This is the critical point of one embodiment of the present invention. More specifically, the inventors decided that the electric dipoles at the interface could exhibit the same effects as in the case of a $SiO_2$ film, if the amount of boron entering deep into the SiON film and forming positive charges was reduced, as shown in FIG. 3. FIG. 3 is a schematic view showing the impurity distribution and the bonding state of atoms at the silicide/insulating film interface, to explain the difference in work function modulation through impurity segregation.

Figure 4:
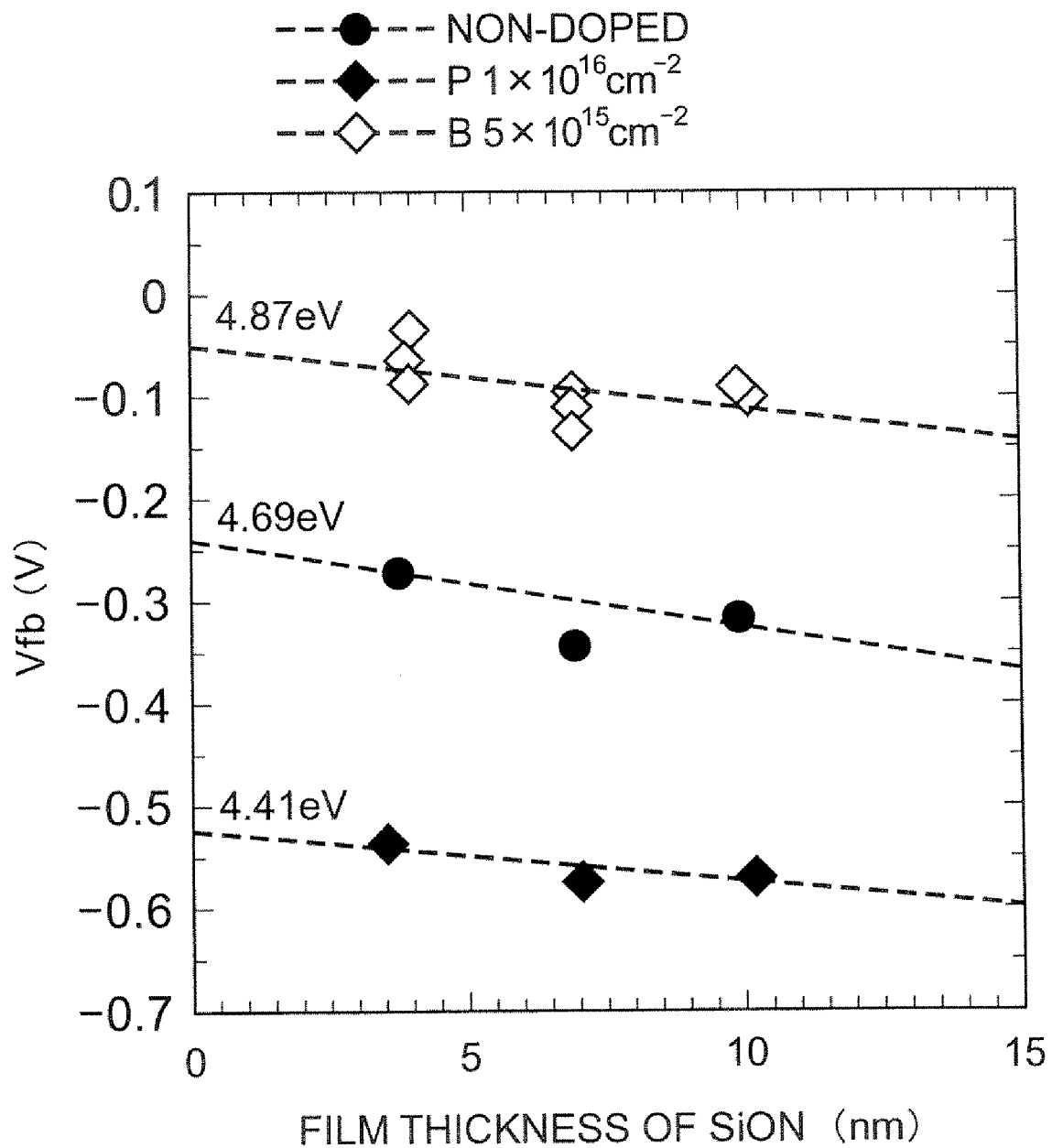
FIG. 4 shows the results of an experiment that was carried out to confirm a work function modulation effect by virtue of the impurity segregation at the silicide/insulating film interface.

Here, as a technique for forming the boron distribution shown in FIG. 3, a method of adding boron after the silicide formation (also referred to as the "post-addition") was proved to be effective. FIG. 4 shows the results of an experiment that was carried out to successfully increase the work function of a NiSi/SiON structure by about 0.2 eV through the post-addition of boron. The results also show that the work function of a NiSi/SiON structure can be reduced by about 0.3 eV through post-addition of phosphorus (P).

Figure 5:
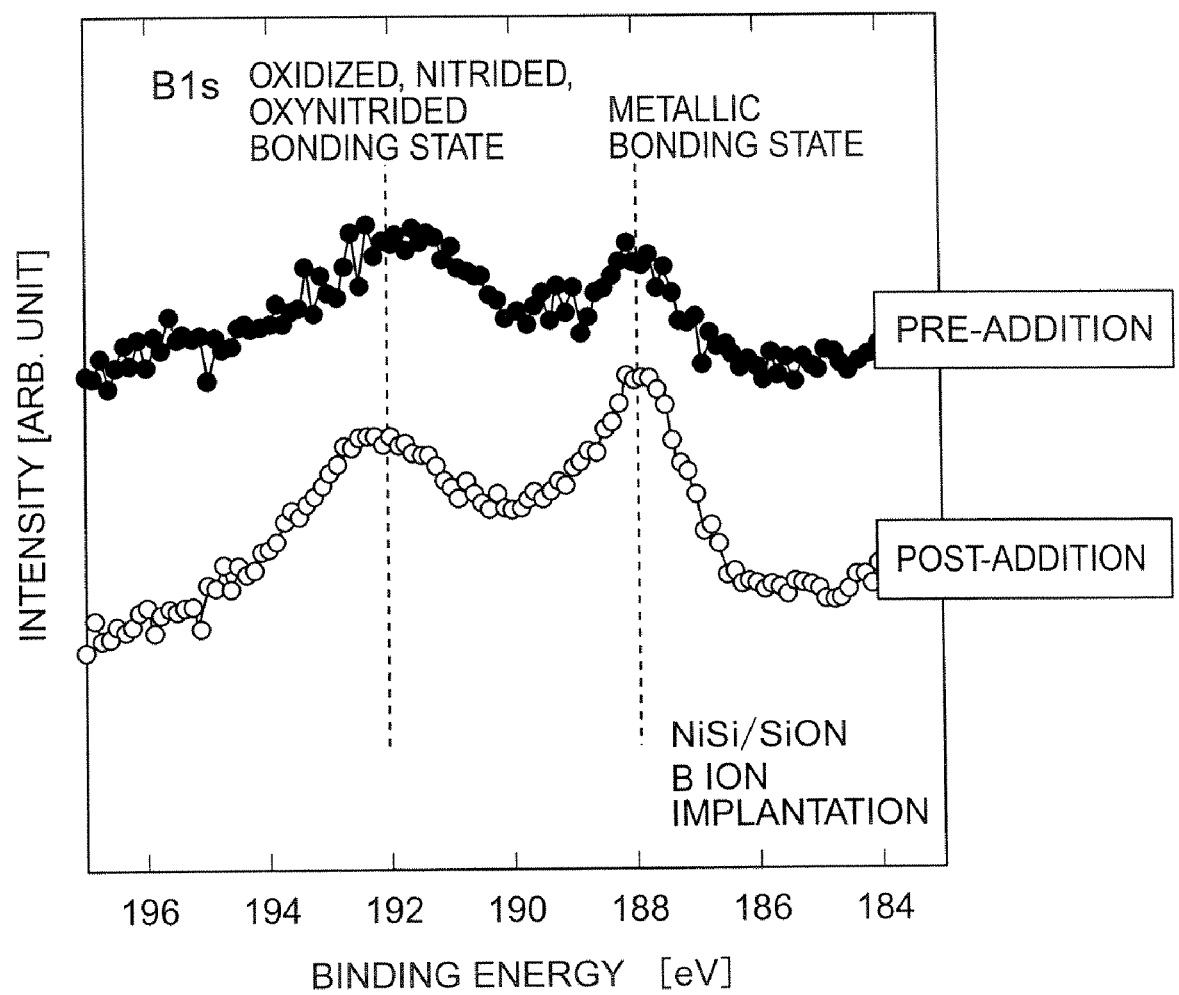
FIG. 5 shows the results of an XPS experiment that was carried out to analyze the difference in the biding state of the interface segregated impurities between the pre-addition and the post-addition.

In FIG. 4, the abscissa axis indicates the thickness of the SiON film, and the ordinate axis indicates the flat band voltage Vfb. FIG. 5 shows the results of an experiment that was carried out to examine the bonding state of boron segregated near the interface by the XPS (X-ray Photoelectron Spectroscopy) method. The experiment results were obtained in the following manner. A NiSi/SiON structure was produced by eliminating the Si portions from a NiSi/SiON/Si stack structure through a combination of a physical polishing technique and an etching technique with a chemical solution. The NiSi/SiON structure was measured on the side of the SiON by the XPS method. The bonding state of impurities (boron) at the NiSi/SiON interface was then analyzed to obtain the experiment results. The signal intensity of XPS depends on the depth of each sample from its surface, and attenuates exponentially. In this experiment, a SiON film used in a case where silicidation was performed after boron is added to the silicon as in the conventional art, or in a case where boron was added prior to the silicide formation (referred to as the "pre-addition"), is slightly thicker. The absolute value of the signal intensity of the boron buried in the lower portion of the SiON film is smaller in the case of the pre-addition. Accordingly, when the pre-addition and the post-addition (one embodiment of the present invention) are compared in this drawing, only the relative intensity ratio with respect to the respective bonds is examined. In the case of the pre-addition, a large amount of boron enters the SiON film, and the intensity of the oxidized, nitrided, or oxynitrided state is relatively higher than the intensity of the metallic bonding state. Here, the oxidized, nitrided, or oxynitrided state is a situation in which the atoms bonded to one boron atom are only of oxygen or nitrogen, or are of both oxygen and nitrogen. In the case of the post-addition as one embodiment of the present invention, on the other hand, the amount of boron in the oxidized, nitrided, or oxynitrided bonding state is relatively smaller than the amount of boron in the metallic bonding state. Higher signal intensity is normally observed in a component closer to the surface of the sample. With this principle of XPS being taken into consideration, the oxidized, nitrided, or oxynitrided bonds can be determined to be much fewer in number than the metallic bonds in this structure, since the intensity of the oxidized, nitrided, or oxynitrided bonds supposedly closer to the surface is lower than the intensity of the metallic bonds. This assumption is supported by the boron distributions and bonding states schematically shown in FIGS. 2B and 3.

Figure 6:
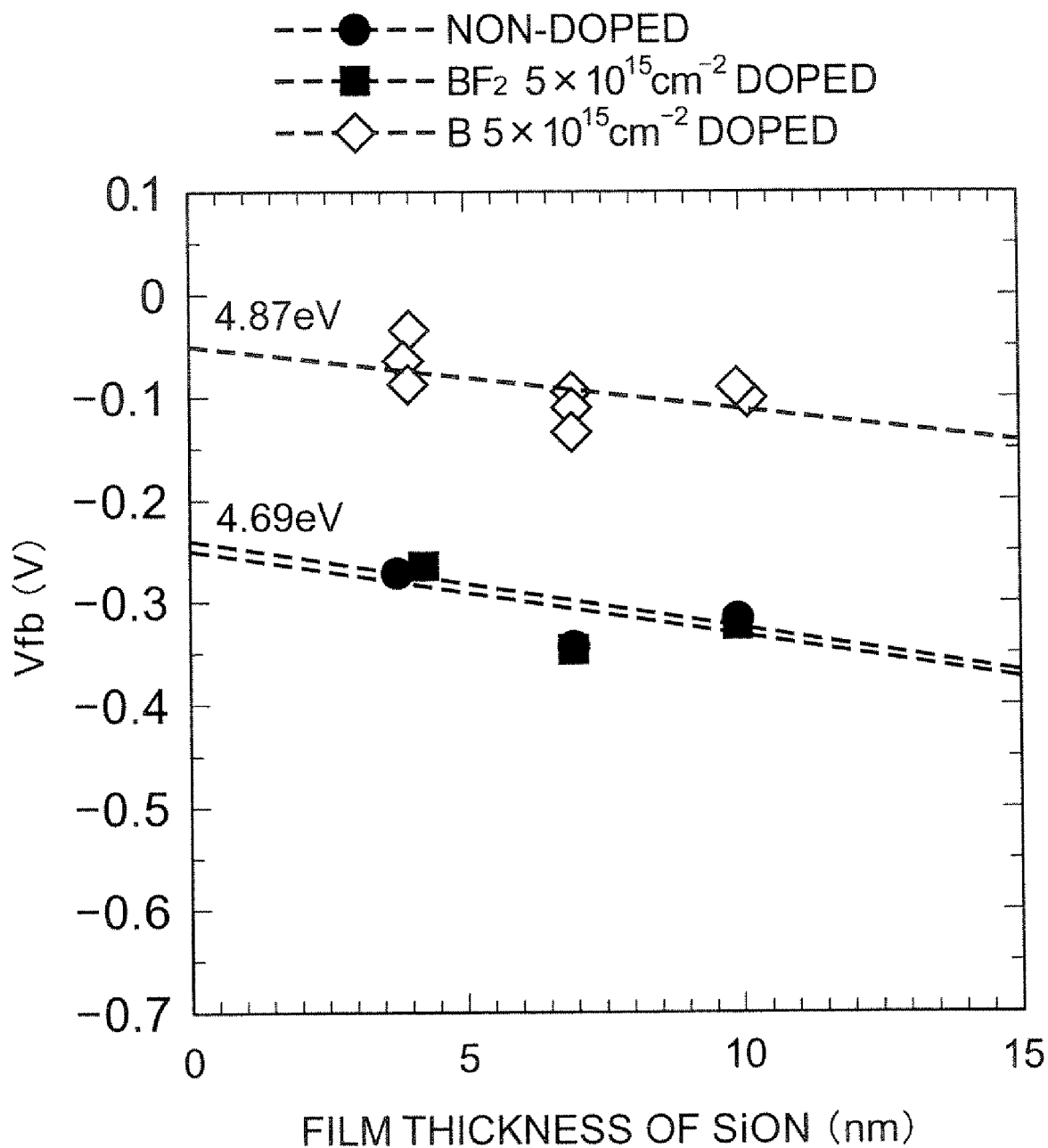
FIG. 6 shows the results of an experiment that was carried out to examine the difference in work function modulation caused by different methods for introducing boron impurities.
Figure 7:
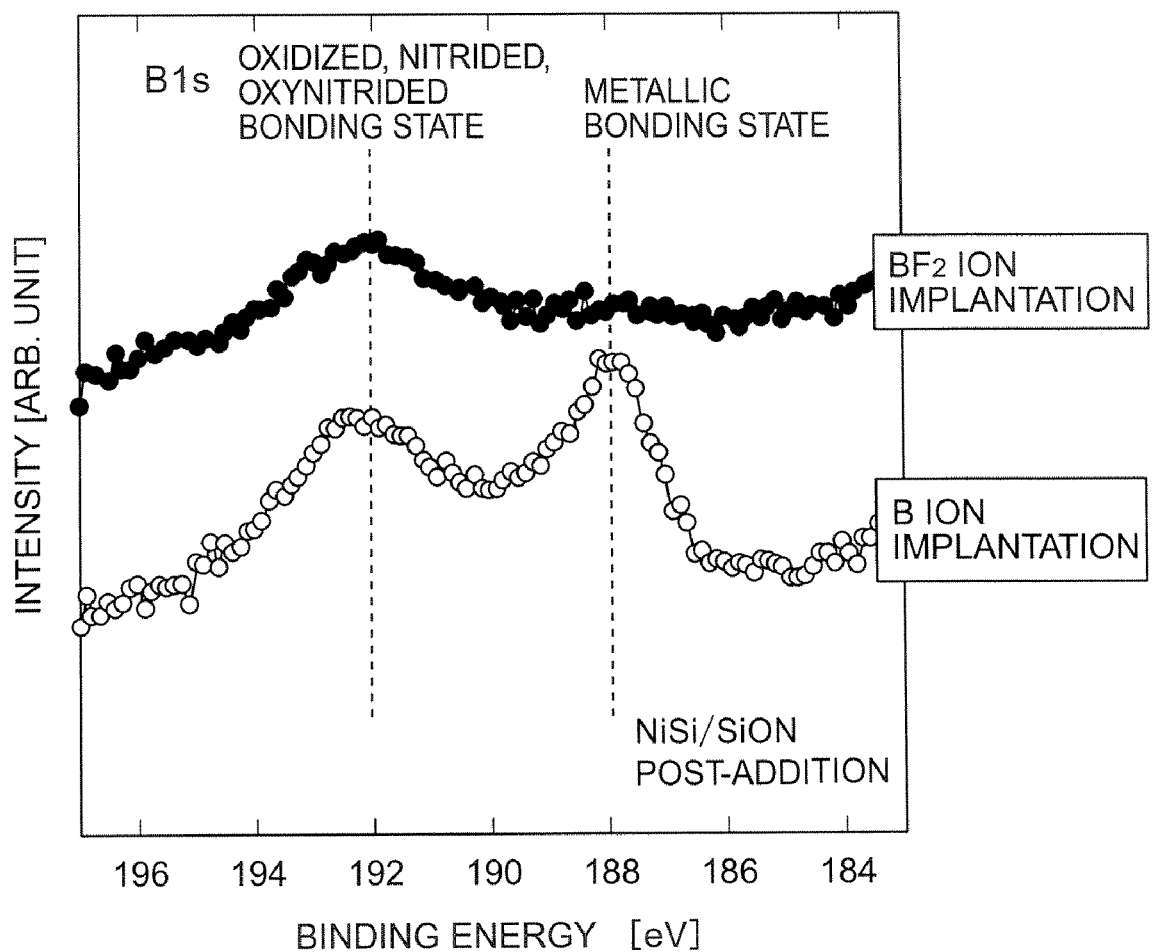
FIG. 7 shows the results of an XPS experiment that was carried out to analyze the difference in the biding state of the interface impurities and to identify the cause of the difference in work function modulation due to the different methods for introducing boron impurities.
Figure 8A:
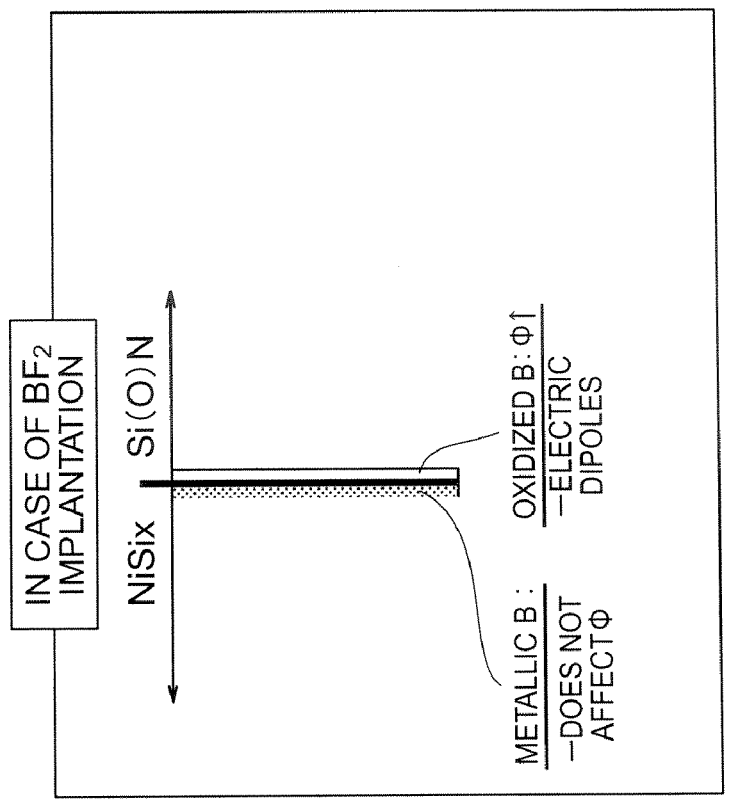
FIGS. 8A and 8B schematically show the impurity distributions and bonding states at the silicide/insulating film interface, so as to explain the difference in work function modulation due to the different methods for introducing boron impurities.
Figure 8B:
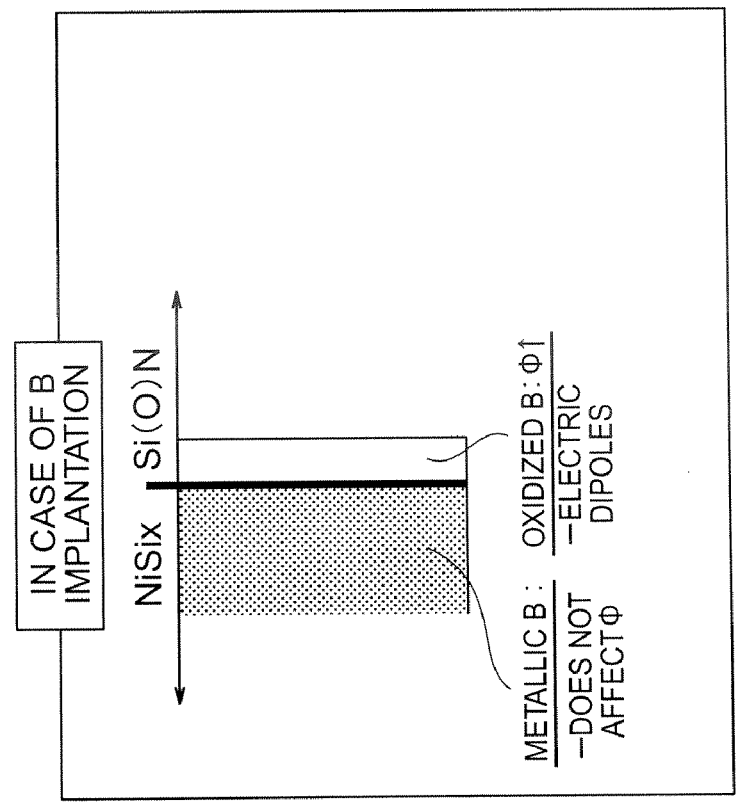

When the post-addition of boron was performed, the inventors employed an ion implantation technique. Comparing the work function obtained through boron ion implantation with the work functions obtained through $BF_2$ ion implantation, the inventors found that the desired effect of increasing the work function in one embodiment of the present invention could be achieved only through the boron ion implantation (see FIG. 6). FIG. 6 shows the results of an experiment that was carried out to examine the difference in work function modulation caused by different methods for introducing boron impurities. FIG. 7 shows the results of an XPS experiment that was carried out to examine the bonding state of the boron segregated at the interface in the above experiment. The absolute amount of boron reaching the interface is small in the case of the $BF_2$ ion implantation, and the work function modulation effect shown in FIG. 6 cannot be obtained in this case. In the case of the boron ion implantation, on the other hand, the above described boron distribution and bonding state can be realized, and accordingly, the desired work function modulation can be achieved. FIGS. 8A and 8B schematically show both boron segregation states observed through the B ion implantation and the $BF_2$ ion implantation.

The identification of a boron bonding state as described above can also be performed by analyzing a device in accordance with one embodiment of the present invention. More specifically, a cross-section of a NiSi/SiON stack structure having boron segregated at the interface is observed by the conventional TEM (Transmission Electron Microscopy) method. An electron beam of TEM is then emitted onto a region in the vicinity of the segregation layer at the interface, so as to detect the boron biding state from the loss spectrum of the electron beam. This is the so-called TEM-EELS (Electron Energy Loss Spectroscopy) method. By the TEM method, the structural interface between NiSi and SiON is clearly indicated. An electron beam is then emitted onto the target spot, and the loss spectrum at the spot is obtained. In this manner, it becomes apparent that the boron in the metallic bonding state is the dominant component in the region of about 1 nm from the NiSi/SiON interface on the NiSi side, and the boron in the oxidized, nitrided, or oxynitrided state is the dominant component in the region of about 1 nm from the NiSi/SiON interface on the SiON side. As can be seen from the experiment results in FIGS. 5 and 7, there is a difference of about 4 eV in energy between the boron in the metallic bonding state and the boron in the oxidized, nitrided, or oxynitrided state. The difference can be clearly distinguished by the energy resolution of the TEM-EELS method.

Although, SiON is used in the above description, a silicon nitride film can also be used to achieve the same effects. Since a silicon nitride film contains a larger amount of nitrogen than a SiON film, there is a higher probability of defect formation when a 13-group element such as boron or Al is segregated.

This problem can be solved by appropriately controlling the impurity distribution according to the present invention.

With the above described structure, increases in Vth that have been caused by the phenomenon specific to the FUSI/high-k interface can be prevented by virtue of an interface SiON layer. In this manner, a semiconductor device having a low-Vth FUSI-gate CMOS device that includes a gate insulating film made of a high-k material can be provided. In such a semiconductor device, the high-k material serves to optimize the threshold voltage Vth of each transistor, based on the work function modulation through impurity segregation, which has been the advantage of the conventional FUSI technique.

First Embodiment

Figure 9:
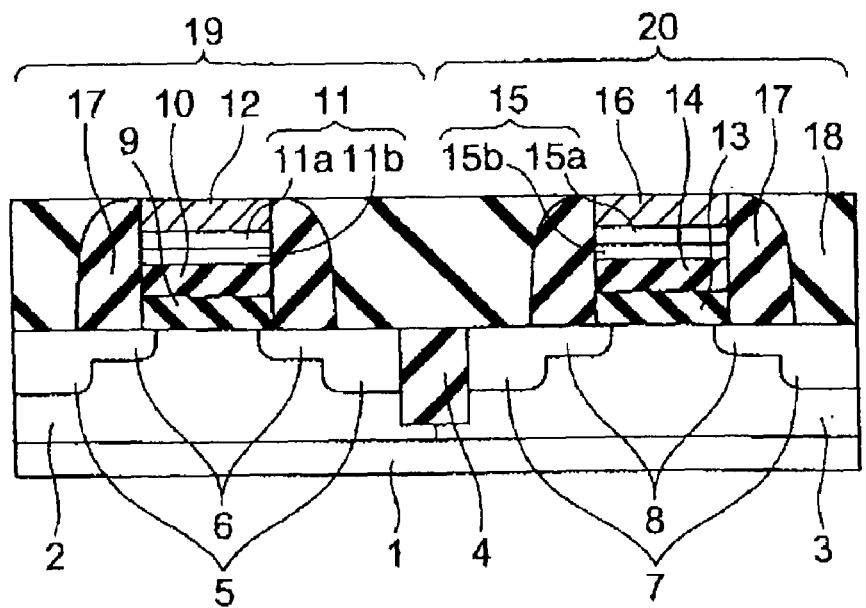
FIG. 9 is a cross-sectional view of a CMOSFET in accordance with a first embodiment of the present invention, taken along the gate length direction.

A semiconductor device in accordance with a first embodiment of the present invention is now described. The semiconductor device of this embodiment is a CMOS transistor, and a section of the CMOS transistor is shown in FIG. 9.

As shown in FIG. 1, an n-type well region (an n-type semiconductor layer) 2 and a p-type well region (a p-type semiconductor layer) 3 are formed on a semiconductor substrate 1. The n-type well region 2 and the p-type well region 3 are isolated from each other by a device isolating layer 4 of a STI (Shallow Trench Isolation) structure.

A p-channel MIS transistor 19 is provided in the n-type well region 2. The p-channel MIS transistor 19 includes p-type diffusion layers 5, p-type extension layers 6, a gate insulating film 9, a buffer layer 10, an impurity segregation layer 11, and a gate electrode layer 12. The gate insulating film 9 is provided on the n-type well region 2. The buffer layer 10, the impurity segregation layer 11, and the gate electrode layer 12 are formed on the gate insulating film 9. In this embodiment, sidewalls 17 made of an insulating material are provided on both sides of the stack structure that is formed with the gate insulating film 9, the buffer layer 10, the impurity segregation layer 11, and the gate electrode layer 12.

The p-type extension layers 6 are provided at the portions of the n-type well region 2 on both sides of the stack structure formed with the gate insulating film 9, the buffer layer 10, the impurity segregation layer 11, and the gate electrode layer 12. The p-type diffusion layers 5 are provided at the portions of the n-type well region 2 on both sides of the sidewalls 17. The p-type diffusion layers 5 are designed to have a deeper junction with the n-type well region 2 than the p-type extension layers 6. The p-type diffusion layers 5 and the p-type extension layers 6 form the source/drain regions of the p-channel MIS transistor 19.

An n-channel MIS transistor 20 is provided in the p-type well region 3. The n-channel MIS transistor 20 includes n-type diffusion layers 7, n-type extension layers 8, a gate insulating film 13, a buffer layer 14, an impurity segregation layer 15, and a gate electrode layer 16. The gate insulating film 13 is provided on the p-type well region 3. The buffer layer 14, the impurity segregation layer 15, and the gate electrode layer 16 are formed on the gate insulating film 13. In this embodiment, sidewalls 17 made of an insulating material are provided on both sides of the stack structure that is formed with the gate insulating film 13, the buffer layer 14, the impurity segregation layer 15, and the gate electrode layer 16.

The n-type extension layers 8 are provided at the portions of the p-type well region 3 on both sides of the stack structure formed with the gate insulating film 13, the buffer layer 14, the impurity segregation layer 15, and the gate electrode layer 16. The n-type diffusion layers 7 are provided at the portions of the p-type well region 3 on both sides of the sidewalls 17.

The n-type diffusion layers 7 are designed to have a deeper junction with the p-type well region 3 than the n-type extension layers 8. The n-type diffusion layers 7 and the n-type extension layers 8 form the source/drain regions of the n-channel MIS transistor 20.

In the first embodiment, the gate insulating films 9 and 13 of both MIS transistors 19 and 20 are made of the same material, the buffer layers 10 and 14 of both MIS transistors 19 and 20 are made of the same material, and the gate electrode layers 12 and 16 of both MIS transistors 19 and 20. More specifically, the buffer layers 10 and 14 are formed with silicon oxynitride films or silicon nitride films. If the buffer layers 10 and 14 are silicon oxynitride films, the nitride concentration in the films is preferably in the range of 3 atomic % to 15 atomic %. With this arrangement, SiON films with fewer structural defects can be formed, providing very stable electrical characteristics. If the buffer layers 10 and 14 are silicon nitride films (SiN films), the silicon nitride films preferably have perfect compositions of $Si_3N_4$. With this arrangement, SiN films with fewer structural defects can be formed, providing very stable electrical characteristics.

The impurity segregation layers 11 and 15 are regions with a thickness of approximately 2 nm that are formed around the interfaces with the gate electrodes 12 and 16 and the buffer layers 10 and 14. The impurity segregation layer 11 has a first sub-layer 11a formed in the gate electrode 12 and a second sub-layer 11b formed in the buffer layer, and the impurity segregation layer 15 has a first sub-layer 15a formed in the gate electrode 16 and a second sub-layer 15b formed in the buffer layer 14. A large quantity of impurities other than the elements constituting the gate electrodes and the interface buffer layers are segregated in those regions.

The impurities contained in the impurity segregation layer 11 include a 13-group element, preferably boron. Segregation of this element leads to the increase of the work function of the gate electrode. In particular, boron is conventionally used for LSIs, and can be readily introduced into products.

The impurities contained in the impurity segregation layer 15 include a 15-group element, preferably phosphorus, arsenic, or antimony. Those elements are conventionally used for LSIs, and can be readily introduced into products. With this arrangement, the work function of the gate electrode is effectively reduced.

More specifically, in this embodiment, the bonding state of the impurities in the impurity segregation layer 11 is characterized that total number of metallic bonds eccentrically located on the side of the gate electrode 12 is larger than the total number of each of oxidized, nitrided, or oxynitrided bonds eccentrically located on the side of the buffer layer 10. Here, the total number of bonds is proportional to the area of the peak corresponding to each bond in the XPS spectrum shown in FIG. 5, for example. Accordingly, the work function of the gate electrode can be increased by a 13-group element such as boron, whether it is on a SiON film or a SiN film.

Each of the gate electrodes 12 and 16 is made of a metal silicide having a work function ranging from 4.55 eV or more to 4.75 eV or less. Such a work function is observed near the center of the Si band gap. Impurities of different types are segregated with respect to the midgap metal electrode, so that the effective work function is reduced to lower the threshold voltage Vth in the n-channel MIS transistor, and the work function is increased to lower the threshold voltage Vth in the p-channel MIS transistor. Thus, threshold voltages Vth that are substantially symmetric with each other can be obtained. Examples of metal silicides that exhibit such a work function include a metal silicide containing at least Ni or Co. In view of the past applications and implementations in LSIs, it is more preferable to employ Ni. Also, 5% in metal ratio of such a metal silicide may be Pt, so as to provide higher heat resistance.

The film thickness of each of the first and second interface buffer layers 10 and 14 made of SiON or SiN is preferably in the range of 0.1 nm or more to 1 nm or less in terms of $SiO_2$. If the film thickness is smaller than 0.1 nm, it is impossible to solve the two problems of a decrease in the work function and the disappearance of the impurity segregating effect that are often caused in the interface between a silicide and a high-k film. If the film thickness is larger than 1 nm, high-speed operations that are expected from CMOS transistors cannot be realized.

The gate insulating films 9 and 13 are formed with high-k films. Most desirable high-k films are made of nitrogen-added hafnium silicate (HfSiON). This is because HfSiON exhibits very high compatibility with a high-temperature silicon gate process (at 1000° C., typically) that is necessary according to the FUSI technique, and also because HfSiON is the high-k material having the highest heat resistance today. The SiON/HfSiON stack structure or the SiN/HfSiON stack structure that characterizes this embodiment has substantially the same elements, and accordingly, has a very stable structure in terms of thermodynamics. Thus, the stack structure of this embodiment exhibits stable electric characteristics.

As is be apparent from the explanation of the development of the present invention, the high-k films 9 and 13 are not requisite in this embodiment, and the gate stack structures may not include the high-k films 9 and 13.

In this embodiment, the n-type well region 2 and the p-type well region 3 are formed with a Si or Ge semiconductor.

(Manufacturing Method)

Next, a method for manufacturing the semiconductor device of the first embodiment is described.

FIGS. 10 through 17 illustrate the procedures for manufacturing the semiconductor device of the first embodiment.

First, the n-type well region 2 and the p-type well region 3 isolated from each other by the STI device isolation layer 4 are formed on the semiconductor substrate 1. A gate insulating film 21, a buffer layer 22, and a silicon layer 23 are deposited on the entire surface of the wafer, so as to form the structure shown in FIG. 10. Here, ion implantation or the like may be performed so as to control the channel impurities to optimize the transistor characteristics.

The gate insulating film 21 is a high-dielectric oxide. For example, the gate insulating film 21 is formed by depositing HfSiON with a thickness of 3 nm (Hf/(Hf+Si) being about 0.5, the nitrogen concentration being 20 atomic %) by MOCVD (Metal Organic Chemical Vapor Deposition). The deposition may be carried out by ALD (Atomic Layer Deposition), MBE (Molecular Beam Epitaxy), or PVD (Physical Vapor Deposition).

The composition of HfSiON is not particularly limited to the above described composition, as long as the effects of this embodiment can be achieved. However, to maintain the high reliability of the insulating film while maintaining a typical dielectric constant of 10 or higher, Hf/(Hf+Si) is preferably in the range of 0.3 to 0.8, and the N concentration is preferably 20% or lower.

The interface buffer layer 22 is made of SiON or SiN. The deposition method to be employed here may be MOCVD, ALD, MBE, or the like. In this embodiment, the silicon layer 23 with a thickness of 70 nm is deposited by the conventional CVD.

Figure 10:
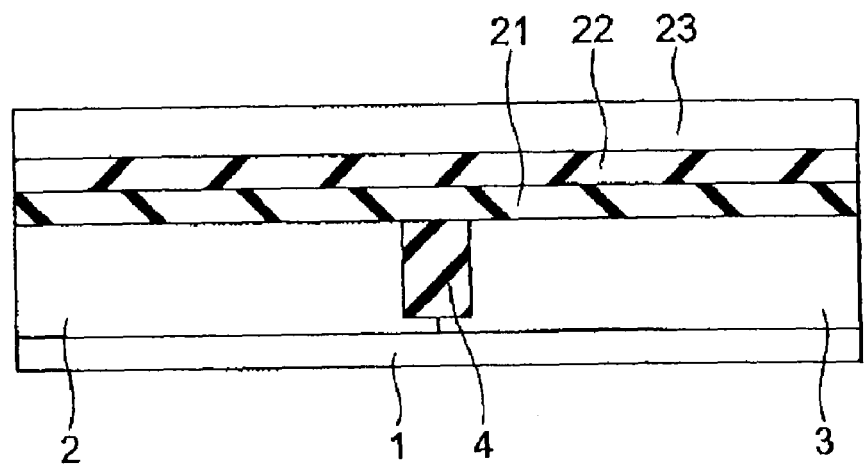
FIGS. 10 to 17 are cross-sectional views showing one of the procedures for manufacturing the CMOSFET in accordance with the first embodiment.
Figure 11:
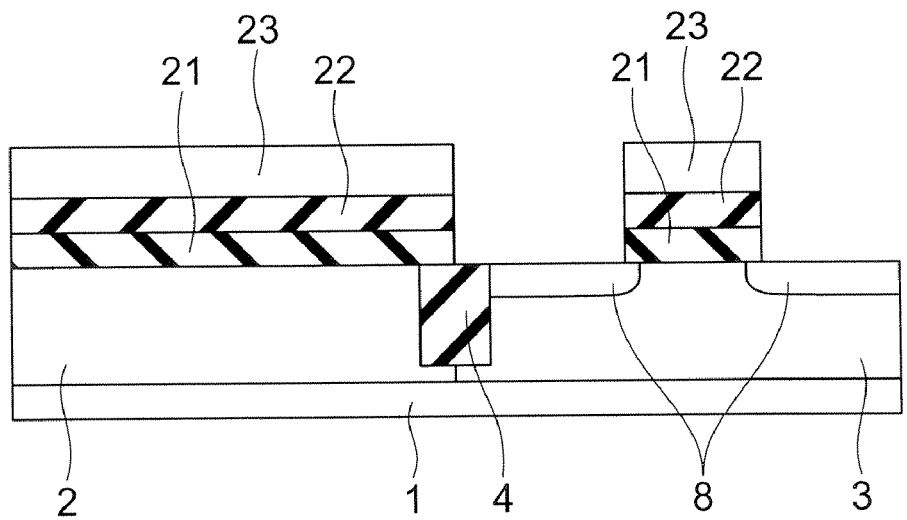
Figure 12:
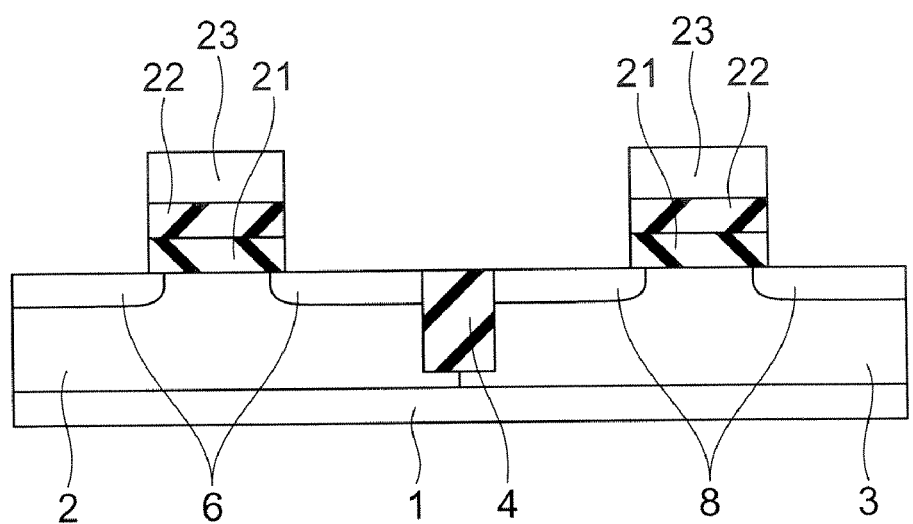
Figure 13:
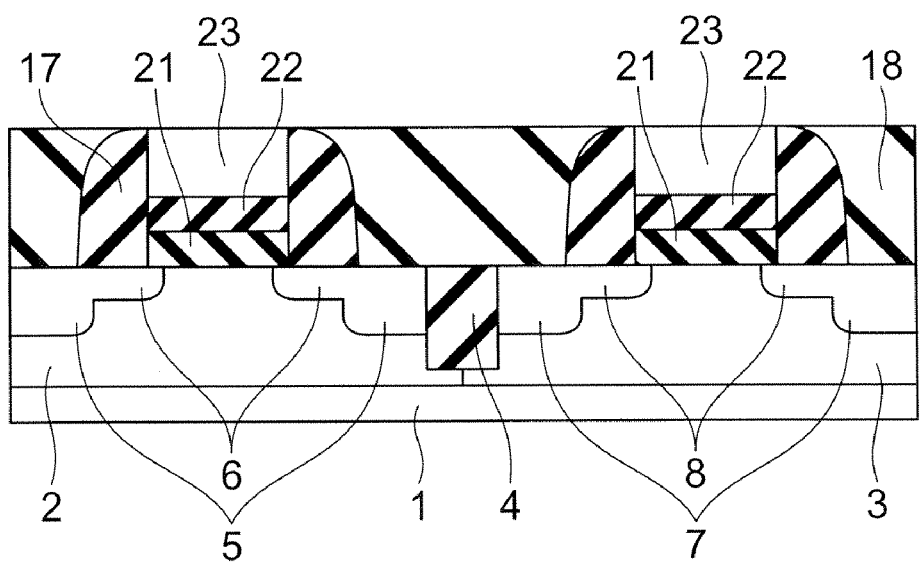

A gate electrode pattern is then formed only above the p-type well region 3 of the structure shown in FIG. 10, with the use of the conventional lithography technique and etching technique. First, a SiN hard mask (not shown) with a thickness of 100 nm is formed on the silicon layer 23 on the n-type well region 2 and the p-type well region 3 by the conventional SiN deposition process and the conventional lithography and etching techniques. With the SiN hard mask serving as a mask, patterning is performed on the silicon layer 23 on the p-type well region 3 with an etching gas that is regularly used. Here, a chlorine or fluorine etching gas is used, so that patterning can be performed on the silicon layer 23 and the interface buffer layer 22 at the same time. The portions of the gate insulating film 21 exposed on the p-type well region 3 on both sides of the SiN hard mask is thoroughly removed by HF wet etching or the like. Further, As ion implantation for extension formation is performed, so as to form n-type extension layers 8 through a "thermal spike treatment" at a high temperature. Here, since the upper surface of the silicon layer 23 is covered with the SiN hard mask, the silicon layer 23 is not doped with As ions. The photoresist and the SiN hard mask are then removed, to form the structure shown in FIG. 11.

Next, a SiN hard mask is formed on the silicon layer 23 on the p-type well region 3 and the n-type well region 2 by the conventional lithography and etching techniques. With the SiN hard mask serving as a mask, patterning is performed on the silicon layer 23 and the interface buffer layer 22 on the n-type well region 2. The portions of the gate insulating film 21 exposed on the n-type well region 2 on both sides of the SiN hard mask is thoroughly removed by wet etching. Further, B ion implantation for extension formation is performed, so as to form p-type extension layers 6 through a "thermal spike treatment" at a high temperature. Here, since the upper surface of the silicon layer 23 is covered with the SiN hard mask, the silicon layer 23 is not doped with boron. The photoresist and the SiN hard mask are then removed, to form the structure shown in FIG. 12.

The sidewalls 17 are next formed. Boron ions are implanted into the n-type well region 2, so as to form the diffusion layers 5. Meanwhile, As ions are implanted into the p-type well region 3, so as to form the diffusion layers 7. At the time of ion implantation to form the diffusion layers 5 and 7, the silicon layers 23 over the n-type well region 2 and the p-type well region 3 are covered with a mask layer. After the mask layer is removed, an interlayer insulating film 18 is formed. Polishing such as CMP (Chemical Mechanical Polishing) is then performed to flatten the interlayer insulating film 18, thereby forming the structure shown in FIG. 13.

Through the series of procedures, this embodiment is characterized in that no impurities are added to the silicon layers 23 in both channel transistors. According to the conventional silicon gate technique, ion implantation is performed also on the gate electrodes at the time of ion implantation for forming extension or diffusion layers. In this embodiment, however, a mask layer is provided on the silicon layers 23 at the time of ion implantation, so as to prevent ion implantation into the silicon layer 23. If implanted ions enter the silicon layers 23, the implanted ions in the silicon layers 23 hinder metal silicidation of the silicon gate to be performed later, and uniform metal silicide layers cannot be formed in both channel transistors.

Figure 14:
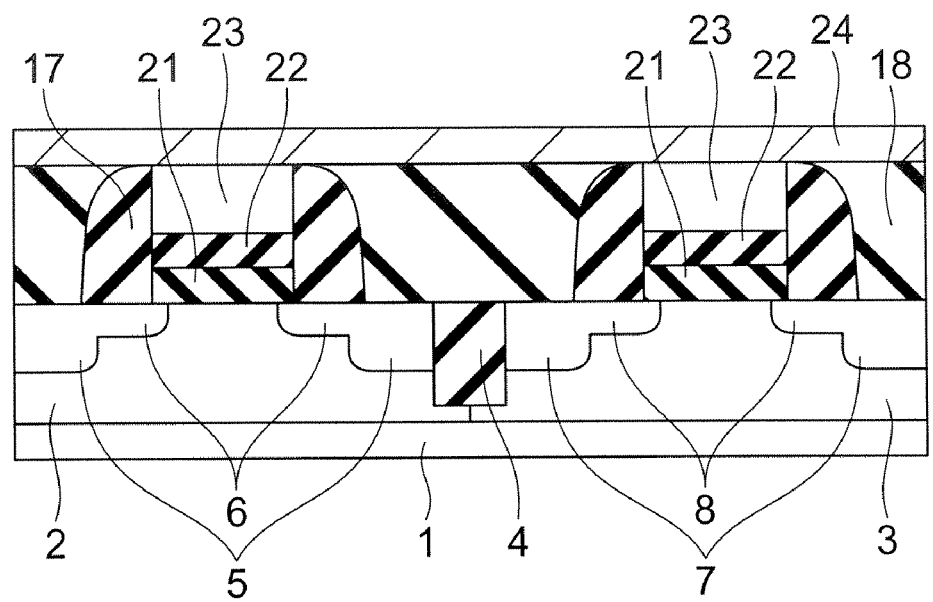

Next, a metal film 24 is deposited to form a metal silicide on the entire surface. Thus, the structure shown in FIG. 14 is formed. Here, the metal film 24 is formed by depositing Ni with a thickness of 40 nm by a sputtering technique.

A heat treatment is then carried out to thoroughly turn the silicon layers 23 into metal silicides 25. Here, the heat treatment is carried out at 450° C. for one minute, so as to form NiSi. The unreacted Ni can be selectively removed with a sulfuric acid solution. Thus, the structure shown in FIG. 15 is formed.

Figure 15:
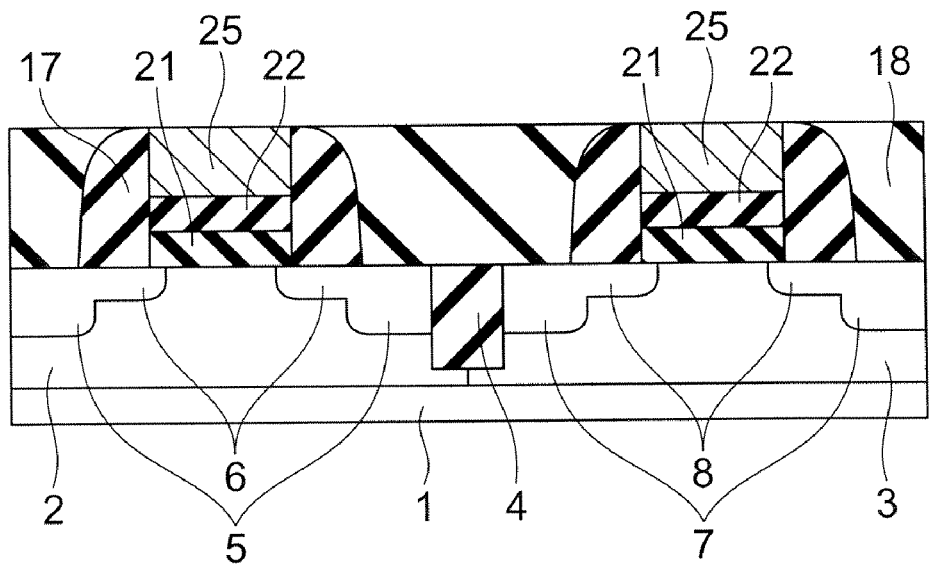

Further, a resist mask layer 26 is formed only above the n-type well region 2 of the structure shown in FIG. 15. Ion implantation is then performed on the entire structure with a 15-group element, so as to form the structure shown in FIG. 16. Here, phosphorus as a 15-group element is implanted with an acceleration energy of 20 keV and a dose amount of $5\times10^{15}/cm^2$.

Figure 16:
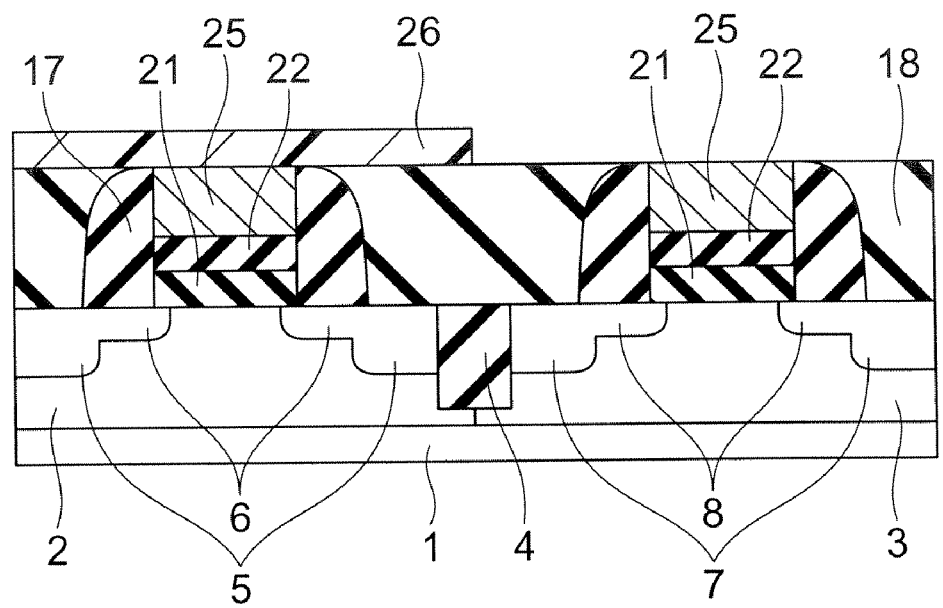

The resist mask layer 26 formed above the n-type well region 2 of the structure shown in FIG. 16 is removed, and a resist mask layer 27 is then formed only above the p-type well region 3. Ion implantation is then performed on the entire structure with a 13-group element, so as to form the structure shown in FIG. 17. Here, boron as a 13-group element is implanted with an acceleration energy of 5 keV and a dose amount of $5\times10^{15}/cm^2$.

Figure 17:
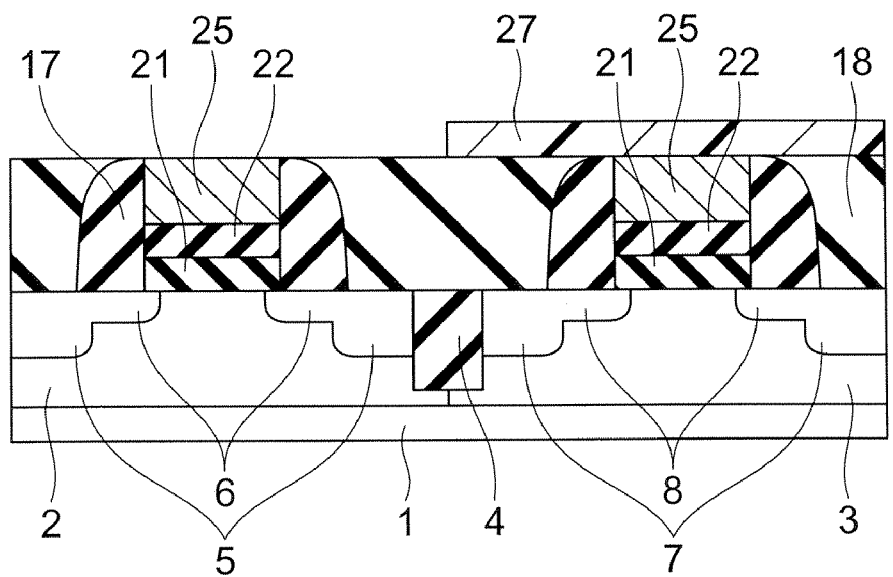

After the resist mask layer 27 is removed from the structure shown in FIG. 17 through a conventional process, a heat treatment is carried out at 450° C. for one minute, for example, so as to thermally diffuse at least part of the 15-group element and the 13-group element implanted into the silicide layers 25. In this manner, the 15-group element and the 13-group element are segregated at the interfaces between the silicide layers 25 and the buffer layers 22. Thus, the impurity segregation layers 11 and 15 are formed at the interfaces of the silicide layers 25 and the buffer layers 22, and the structure shown in FIG. 9 is completed.

In this embodiment, while the NiSi has a work function of 4.65 eV, the effective work function in the p-cannel MIS transistor 19 can be made 4.85 eV by virtue of the modulation effect of boron, and the effective work function in the n-channel MIS transistor 20 can be made 4.35 eV by virtue of the modulation effect of phosphorus. In this manner, a CMOS transistor having appropriate threshold values Vth can be realized.

In this embodiment, a combination of the FUSI technique and the high-k technique can be achieved, without a remarkable increase in insulating film thickness. Thus, in accordance with the first embodiment, a CMOS device having low-resistance gate electrodes that exhibit high heat resistance and do not have the problems of depletion and impurity diffusion or release can be provided.

Also, with the use of the metal suicides as the gate electrodes 12 and 16, an increase of the number of steps for manufacturing a CMOS device can be prevented as much as possible, and a complicated process is no longer required.

(Modifications)

Figure 18:
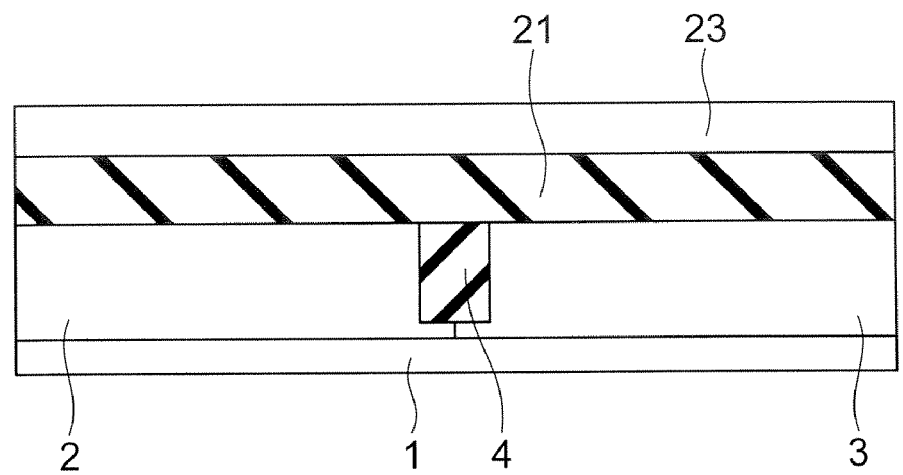
FIGS. 18 to 19 are cross-sectional views showing one of the procedures for manufacturing the CMOSFET in accordance with a modification of the first embodiment.

As modifications of the first embodiment, a gate insulating film made of SiON can be formed in the following manners. The modified procedure is the procedure of depositing an insulating film. Instead of the procedure shown in FIG. 10, a SiON is deposited as the gate insulating film 21, and the silicon layer 23 to be the gates is then deposited on the SiON film, as shown in FIG. 18.

A first specific example of the method for forming the SiON film is as follows. In a case where the semiconductor substrate 1 is a silicon substrate, a silicon oxide film with a film thickness of 1.0 nm to 2.0 nm is deposited by conventional thermal oxidization, and nitrogen with a concentration of 1 atomic % to 15 atomic % is introduced into the $SiO_2$ by conventional plasma nitrization, so as to form a SiON film.

A second specific example of the method for forming the SiON film is as follows. The chamber in which the silicon substrate 1 having the n-type well region 2 and the p-type well region 3 formed thereon is placed is filled with a mixed gas of $N_2$ and $NH_3$, and the surface of the silicon substrate 1 having the n-type well region 2 and the p-type well region 3 formed thereon is maintained at 700° C. In this manner, a silicon nitride film is formed on the n-type well region 2 and the p-type well region 3. The silicon substrate 1 is then heated to 850° C., and is maintained at the temperature. While the silicon substrate 1 is maintained at 850° C., the chamber is filled with a mixed gas of $N_2$ and $O_2$. Accordingly, a silicon oxynitride layer containing oxygen between the silicon substrate 1 and the silicon nitride film and a silicon oxynitride layer containing oxygen on the surface of the silicon nitride film are formed. Thus, a gate insulating film formed with a silicon oxynitride layer, a silicon nitride film, and another silicon oxynitride layer is formed. By the method of the second specific example, a gate insulating film having a three-layer structure formed with a silicon oxynitride layer, a silicon nitride film, and another silicon oxynitride layer is formed.

Figure 19:
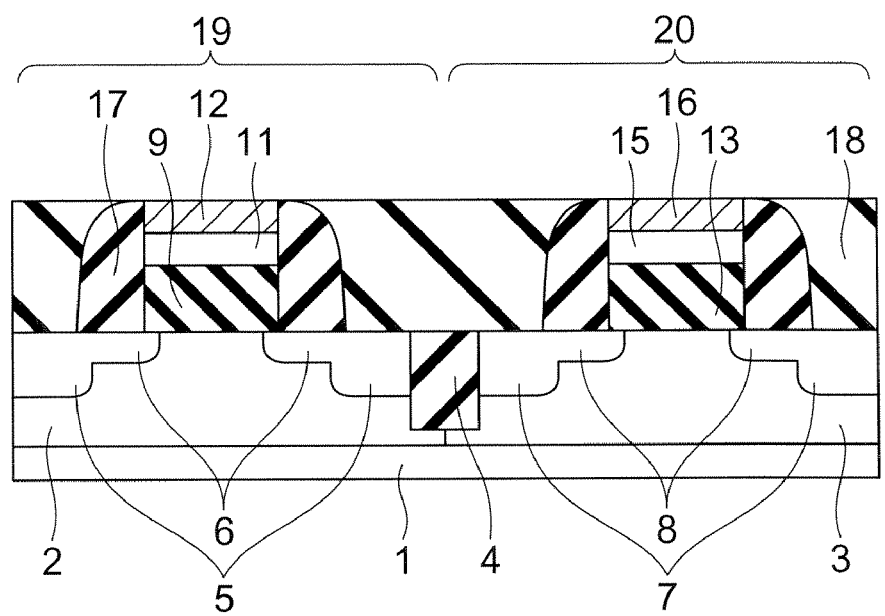

After the SiON film is formed in the above described manner, the same procedures as the procedures illustrated in FIGS. 11 through 17 are carried out to complete the structure shown in FIG. 19. With this structure, a combination of the FUSI technique and a SiON gate insulating film does not hinder desired threshold voltage modulations through boron segregation.

As described above, in the first embodiment and its modifications, a semiconductor device having metal electrodes that are formed on insulating films made of a material with a higher dielectric constant than $SiO_2$ and have the desired work functions can be obtained.

Second Embodiment

Next, a semiconductor device in accordance with a second embodiment of the present invention is described. The semiconductor device of this embodiment is a CMOS transistor, and differs from the semiconductor device of the first embodiment in the following aspects.

In the second embodiment, the gate electrode 12 of the p-channel MIS transistor shown in FIG. 9 is made of a material having a work function in the range of 4.75 eV or more to 5.10 eV or less, and the gate electrode 16 of the n-channel MIS transistor is made of a material having a work function in the range of 4.20 eV or more to 4.55 eV or less.

With the gate electrodes having such work functions, the threshold voltages of the n-channel MIS transistor and the p-channel MIS transistor can be made lower than those in the first embodiment. This feature is especially suitable for a high-speed CMOS transistor that requires low threshold voltages.

The gate electrode 12 of the p-channel MIS transistor is made of at least one of Ni and Co. When the composition ratio of metal to silicon (metal/Si) is 2 or higher, a work function of 4.75 eV or more can be achieved, because of a silicide phase of $Ni_2Si$, $Ni_{31}Si_{12}$, $Ni_3Si$, $Co_2Si$, or the like. Meanwhile, the gate electrode 16 of the n-channel MIS transistor is made of the same metal(s) as the gate electrode 12. When the composition ratio of metal to silicon (metal/Si) is lower than 1, a work function of 4.55 eV or less can be achieved, because of a $NiSi_2$ phase or a $CoSi_2$ phase. Also, approximately 5% of Pt may be contained as the metal in terms of the ratio of metal to silicide. With this arrangement, the heat resistance of each metal silicide becomes higher, and the reliability of the device increases. The added Pt is bonded to silicon, and forms a PtSi phase.

Next, a method for manufacturing the semiconductor device of the second embodiment is described.

FIGS. 20 through 24 illustrate the procedures for manufacturing the semiconductor device of this embodiment. The method for manufacturing the semiconductor device of this embodiment is described, with a case where Ni (nickel) is used as the metal material of the gate electrodes being taken as an example case. It should be noted that substantially the same effects can be achieved if Co is used.

Figure 20:
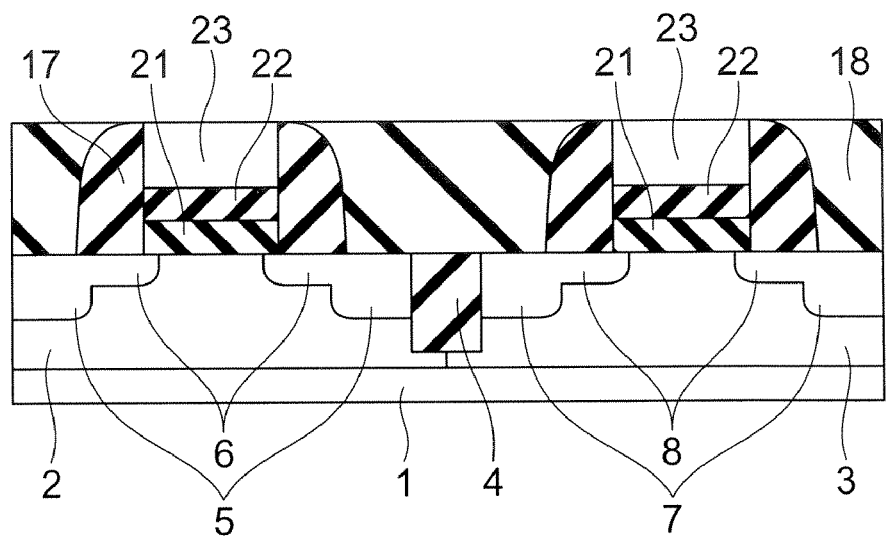
FIGS. 20 to 24 are cross-sectional views showing one of the procedures for manufacturing the CMOSFET in accordance with a second embodiment.

As in the first embodiment, a CMOS device having the gate insulating films 21 of gate stack structures each formed with the silicon layer 23, the buffer layer 22, and a high-k layer is to be formed in this embodiment, as shown in FIG. 20. In the second embodiment, materials having different work functions from each other are used for the metal silicides in the p-channel MIS transistor and the n-channel MIS transistor.

Figure 21:
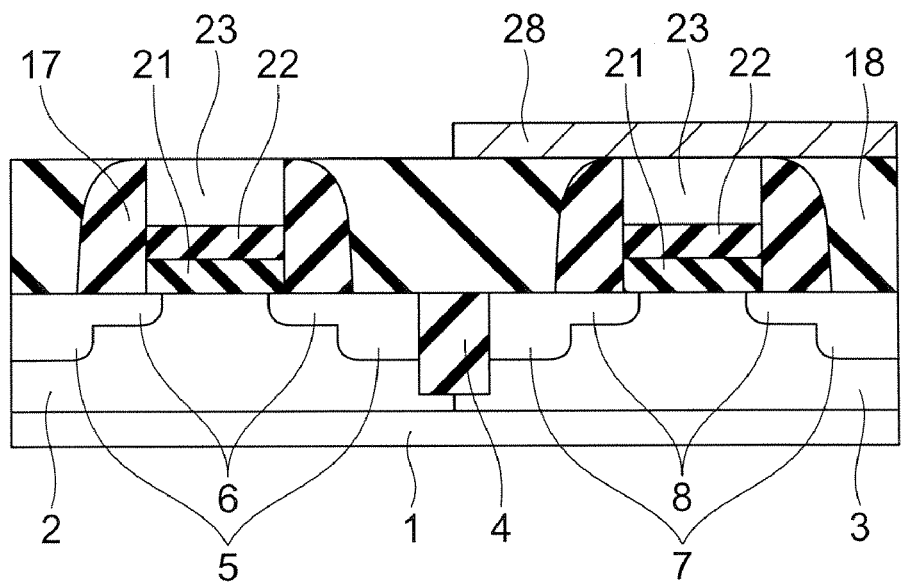
Figure 22:
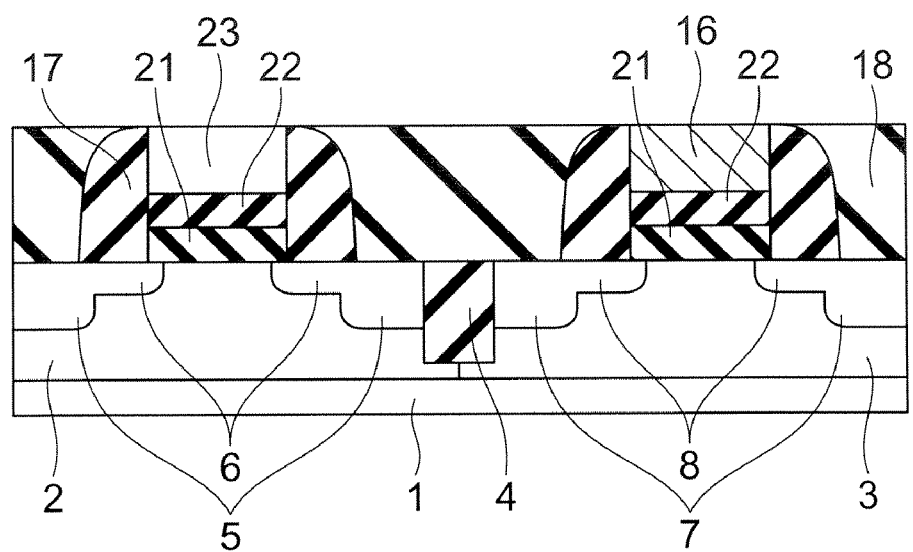

In this embodiment, a Ni layer (a thin film) 28 of 3 nm is deposited only above the p-type well region 3 by a sputtering technique, as shown in FIG. 21. Here, the thickness of each silicon layer 23 is 70 nm. After that, a heat treatment is carried out at 650° C. for 30 seconds, so that Ni is reacted with the silicon layer 23, and a $NiSi_2$ layer 16 is formed. The unreacted Ni is removed with a sulfuric acid solution. In this manner, the structure shown in FIG. 22 is formed. $NiSi_2$ is the most silicon-rich compound among the thermodynamically stable silicide phases of the Ni—Si group, and accordingly, has the smallest work function of 4.55 eV or less.

Figure 23:
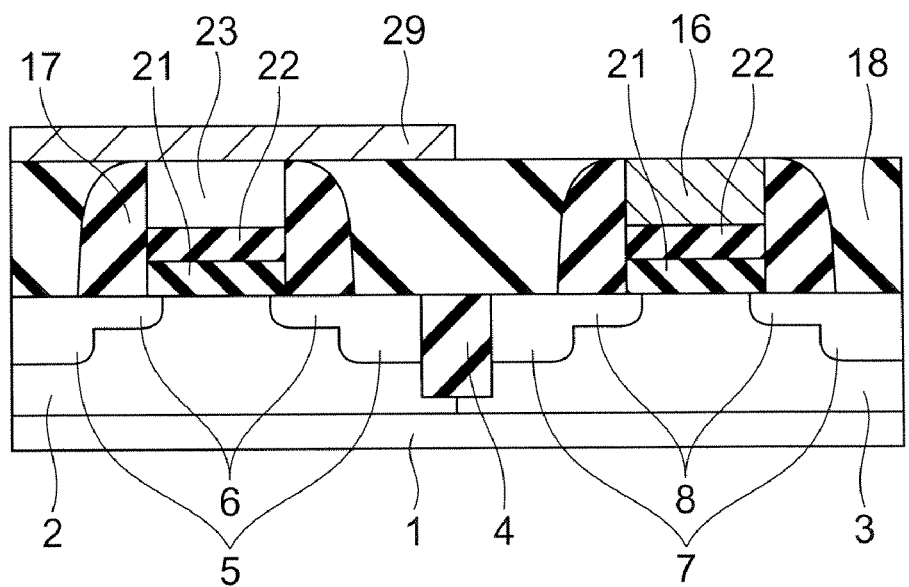
Figure 24:
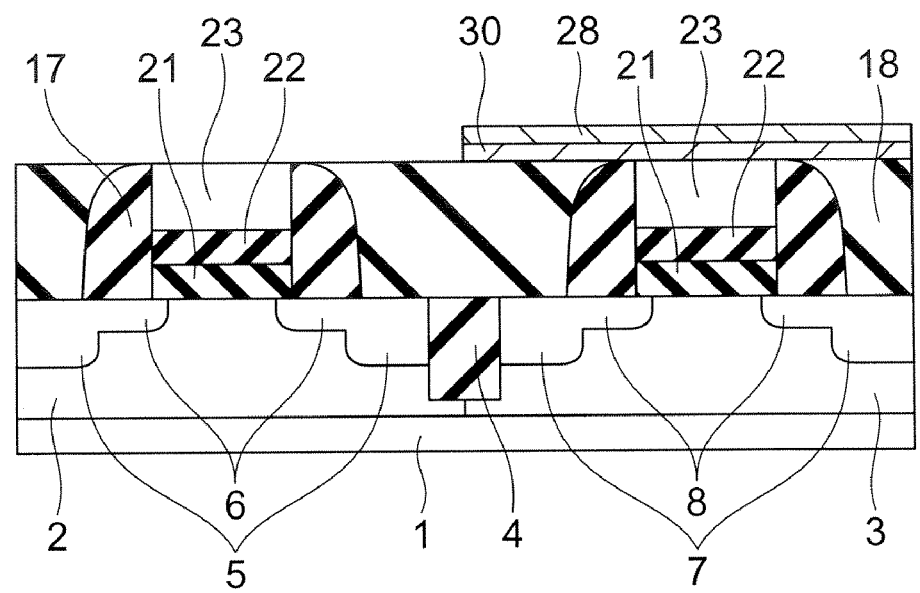

A Ni layer (a thick film) 29 of 10 nm is then deposited only above the n-type well region 2, as shown in FIG. 23. A heat treatment is then carried out at 450° C. for one minute, so that the silicon layer 23 above the n-type well region 2 is converted into a Ni-rich silicide such as $Ni_3Si$. Here, the $NiSi_2$ above the p-type well region 3 is also subjected to the heat treatment. However, $NiSi_2$ is the most thermodynamically stable phase of the Ni—Si group, and there is not an unreacted Ni layer. Therefore, a phase transition to another phase does not occur. The work function of $Ni_3Si$ is approximately 4.85 eV. After the unreacted Ni is removed with a sulfuric acid solution, the impurity segregation layers 11 and 15 are formed through the same procedures as those of the first embodiment. In this manner, the COMS transistor structure shown in FIG. 9 can be obtained.

In the p-channel MIS transistor 19 of this embodiment, $Ni_3Si$ having a work function of 4.85 eV is used for the gate electrode 12, and an effective work function of 5.05 eV is achieved by virtue of the modulation effect of boron. In the n-channel MIS transistor 20, $NiSi_2$ having a work function of 4.55 eV is used for the gate electrode 16, and an effective work function of 4.25 eV is achieved by virtue of the modulation effect of phosphorus. Accordingly, a CMOS transistor having lower threshold voltages Vth than those of the first embodiment can be formed. Alternatively, $Ni_2Si$ having a work function of 4.75 eV may be used for the gate electrode 12 of the p-channel MIS transistor 19, and an effective work function of 4.95 eV may be achieved by virtue of the modulation effect of boron.

In this embodiment, the threshold voltages Vth can be set lower than in the first embodiment. However, the Ni silicides of both channel transistors are produced independently of each other, which results in a larger number of procedures. Furthermore, the device characteristics somehow deteriorate due to the high-temperature process (at 650° C.) for forming $NiSi_2$. The process for solving those problems is as follows. A silicidation control layer 30 made of Ti, Zr, or Hf is deposited by a sputtering technique only above the p-type well region 3 in the structure shown in FIG. 20. A Ni layer 28 of 30 nm is then deposited by a sputtering technique. This structure is then subjected to a heat treatment at 450° C. for one minute, to form a Ni silicide. In general, silicidation in a Ni—Si structure is caused by Ni being the diffusion triggering element. In the structure of this embodiment, however, the Ti layer 30 serves to decelerate the Ni diffusion. Accordingly, the Ni supply to the silicidation side is restrained, and a $NiSi_2$ phase can be formed at a temperature approximately 200° C. lower than the temperature for silicidation that is normally caused without a Ti layer. After that, the same procedures as those of the second embodiment are carried out. The use of the silicidation control layer 30 increases the number of manufacturing steps, but prevents the degradation of the characteristics of the CMOS transistor due to a lower silicide temperature. Since Ni and Co have similarities as the diffusion triggering elements at the time of silicidation, the same effects as those achieved with Ni can be expected with Co. Although the silicidation control layer 30 is a Ti layer in the above description, the same effects as above can be achieved with Zr or Hf, which is similar to Ti in terms of chemical properties.

As described above, in accordance with the second embodiment, a semiconductor device having metal electrodes that are formed on insulating films made of a material with a higher dielectric constant than $SiO_2$ and have the desired work functions can be obtained.

Third Embodiment

Next, a semiconductor device in accordance with a third embodiment of the present invention is described. The semiconductor device of this embodiment is a CMOS transistor, and differs from the semiconductor device of the second embodiment in the following aspects.

In the third embodiment, the gate electrode 12 of the p-channel MIS transistor shown in FIG. 9 is made of a material having a work function in the range of 4.75 eV or more to 5.10 eV or less, and the gate electrode 16 of the n-channel MIS transistor is made of an electrode material having a work function in the range of 4.20 eV or more to 4.55 eV or less, as in the second embodiment. However, the electrode materials in this embodiment are different from those in the second embodiment.

In this embodiment, the gate electrode 12 of the p-channel MIS transistor is formed with a silicide containing at least one of such metals as Pt, Ir, Ru, Pd, and Re. With any of such materials, a work function in the range of 4.75 eV to 5.10 eV can be realized. Meanwhile, the gate electrode 16 of the n-channel MIS transistor is formed with a silicide containing at least one of such rare-earth metals as W, Ti, Zr, Hf, Ta, Nb, and Er. With any of such materials, a work function in the range of 4.20 eV to 4.5 eV can be realized.

Next, a method for manufacturing the semiconductor device of the third embodiment is described.

Figure 25:
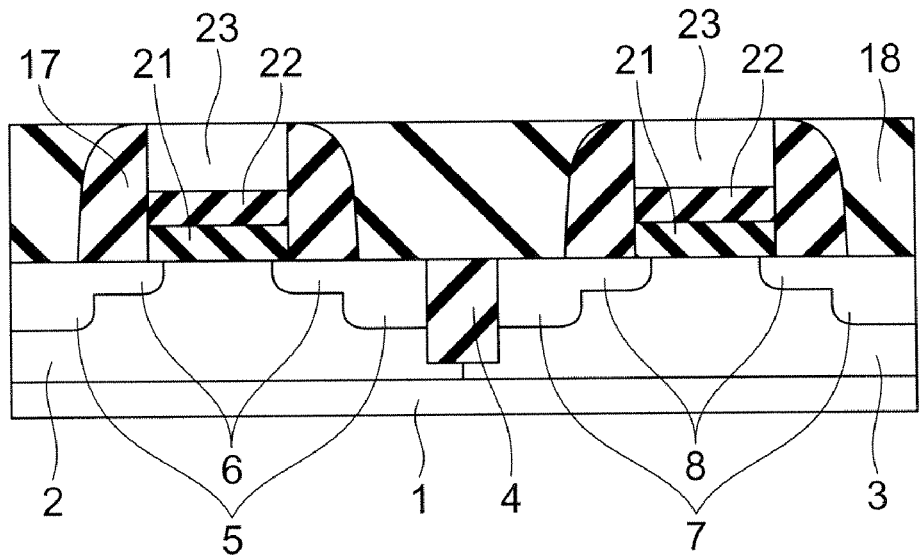
FIGS. 25 to 27 are cross-sectional views showing one of the procedures for manufacturing the CMOSFET in accordance with a third embodiment.
Figure 26:
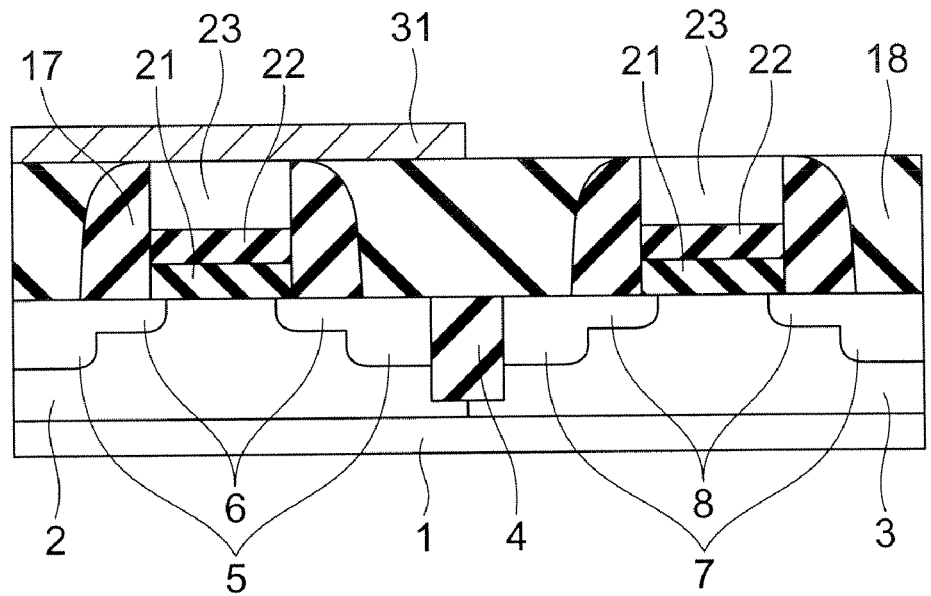
Figure 27:
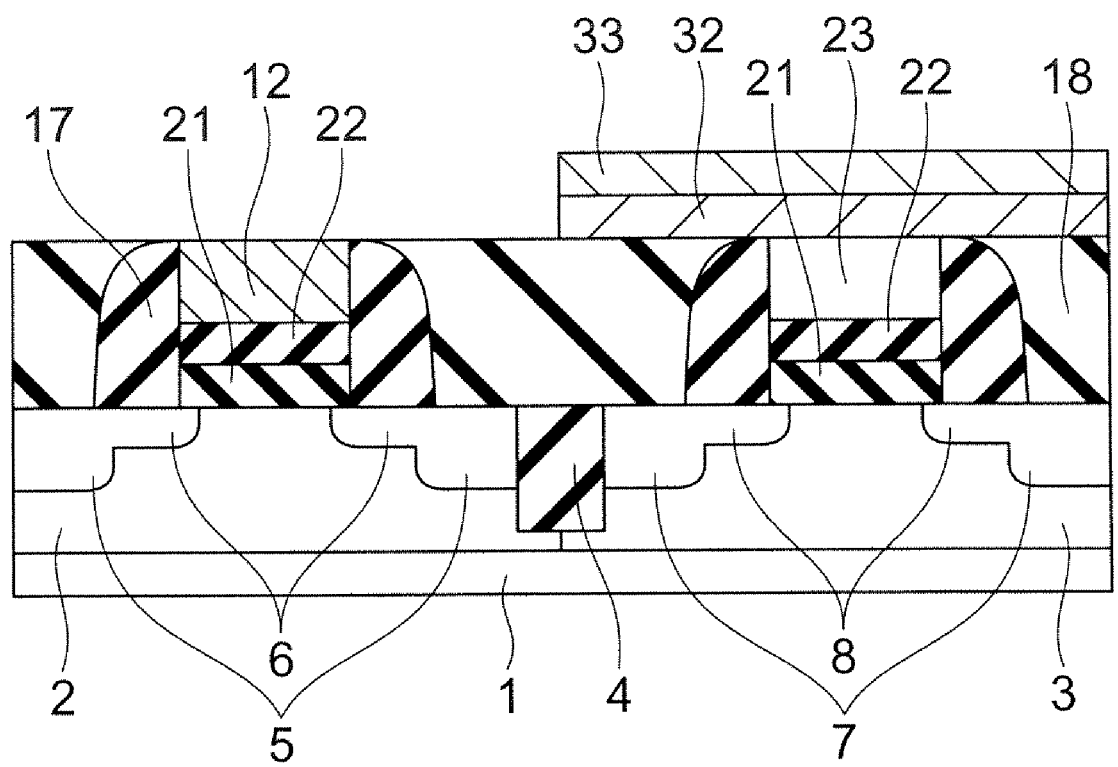

FIGS. 25 through 27 illustrate the procedures for manufacturing the semiconductor device of this embodiment.

As in the first embodiment, a CMOS device having the gate insulating films 21 of gate stack structures each formed with the silicon layer 23, the buffer layer 22, and a high-k layer is to be formed in this embodiment, as shown in FIG. 25. In the third embodiment, materials having different work functions from each other are used for the metal silicides in the p-channel MIS transistor and the n-channel MIS transistor as in the second embodiment.

In this embodiment, a Pt layer 31 of 50 nm is deposited only above the n-type well region 2 by a sputtering technique, as shown in FIG. 26. After that, a heat treatment is carried out at 450° C. for one minute, so that the Pt layer 31 is reacted with the silicon layer 23 (70 nm), and a PtSi layer 12 is formed. The unreacted Pt is removed with aqua regia. An Er layer 32 of 50 nm is then deposited only above the p-type well region 3, and a W layer 33 of 30 nm is deposited on the Er layer 32, so as to form the structure shown in FIG. 27. A heat treatment for this structure is then carried out at 450° C. for one minute, so that the Er layer 32 is reacted with the silicon layer 23, and an $Er_3Si_5$ layer 16 is formed. The unreacted Er is then removed with a sulfuric acid solution, and the W layer 33 is selectively removed. The W layer 33 serves to restrain oxidization of Er at the time of the heat treatment for the Er silicide formation, and stabilize the formation of the $Er_3Si_5$ layer 16. In this manner, a CMOS transistor having a gate electrode made of PtSi in the p-channel MIS transistor and a gate electrode made of $Er_3Si_5$ in the n-channel MIS transistor can be obtained. The impurity segregation layers 11 and 15 are then formed through the same procedures as those of the first embodiment. In this manner, the CMOS transistor structure shown in FIG. 9 is obtained.

In the p-channel MIS transistor of this embodiment, PtSi having a work function of 4.95 eV is used, and an effective work function of 5.15 eV is achieved by virtue of the modulation effect of boron or the like. In the n-channel MIS transistor, $Er_3Si_5$ having a work function of 4.35 eV is used, and an effective work function of 4.05 eV is achieved by virtue of the modulation effect of phosphorus or the like. Accordingly, a CMOS transistor having lower threshold voltages Vth than those of the second embodiment can be formed. This embodiment can provide the lowest threshold voltages Vth among the first through third embodiment. However, silicides made of different metal materials are used in both channel transistors. As a result, this embodiment exhibits drawbacks such as a more complicated manufacturing process and a more complicated device structure.

As described above, in accordance with the third embodiment, a semiconductor device having metal electrodes that are formed on insulating films made of a material with a higher dielectric constant than $SiO_2$ and have the desired work functions can be obtained.

In the above described first through third embodiments, regular flat transistors have been described as examples. However, each of the embodiments of the present invention is characterized by the stack structure of each gate electrode and gate insulating film of a CMOS transistor, and applications of each of the embodiments are not limited by the shapes of transistors. Therefore, each of the embodiments can be implemented not only in flat transistors but also in three-dimensional transistors such as Fin-type transistors.

Fourth Embodiment

Figure 28B:
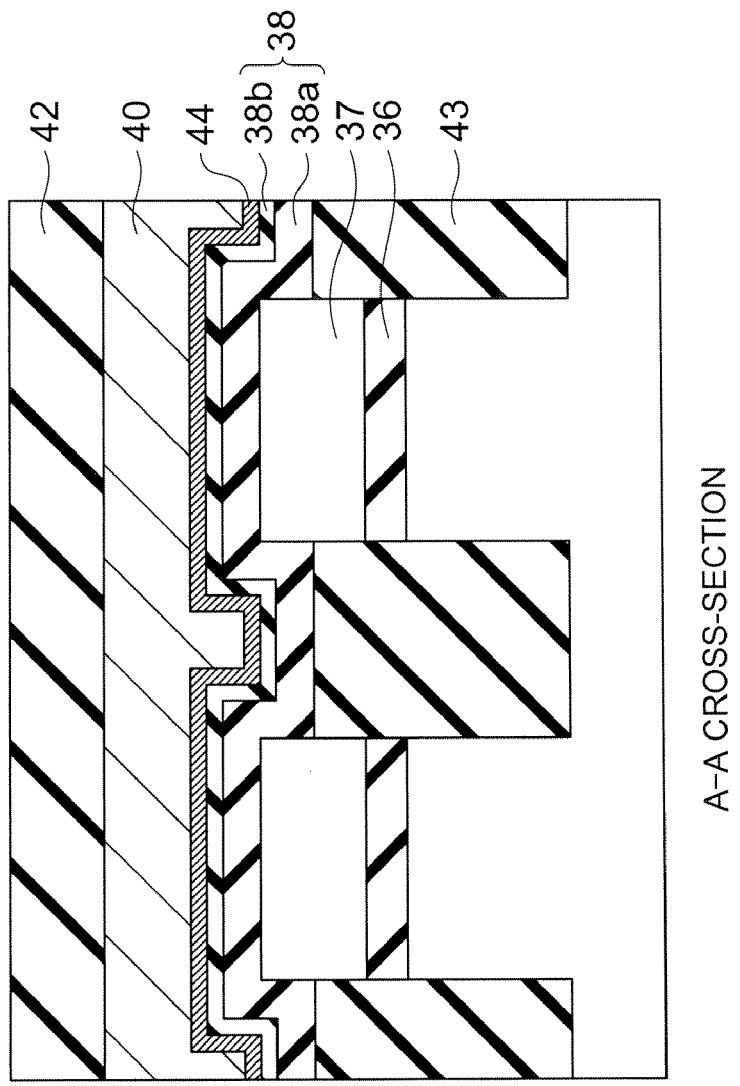
FIGS. 28A and 28B are cross-sectional views of stack-type memory cells in accordance with a fourth embodiment.
Figure 28A:
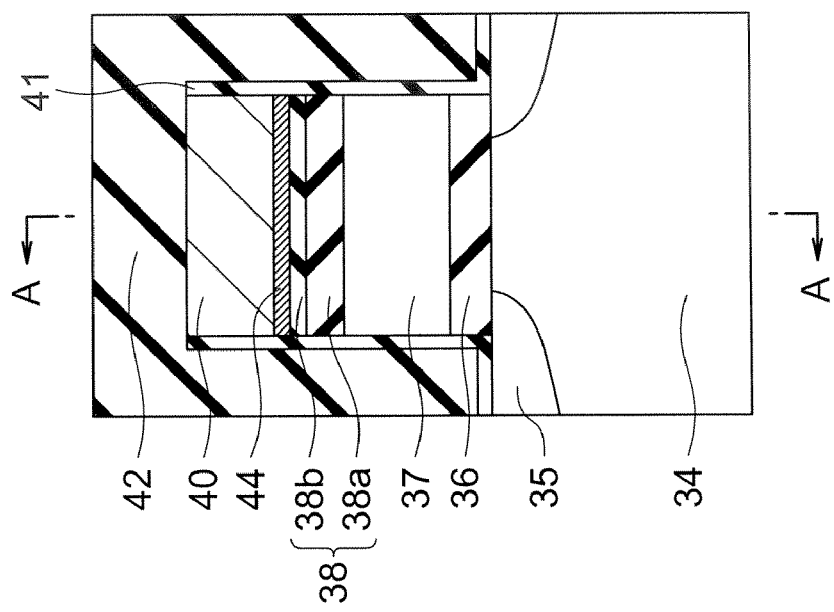
Figure 30B:
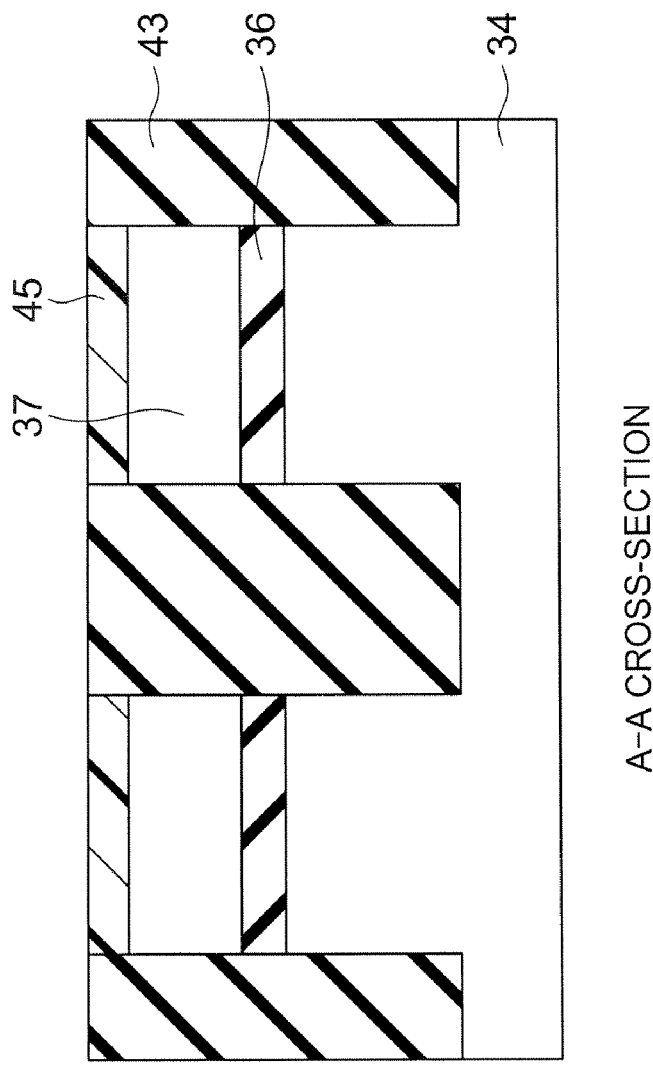
Figure 30A:
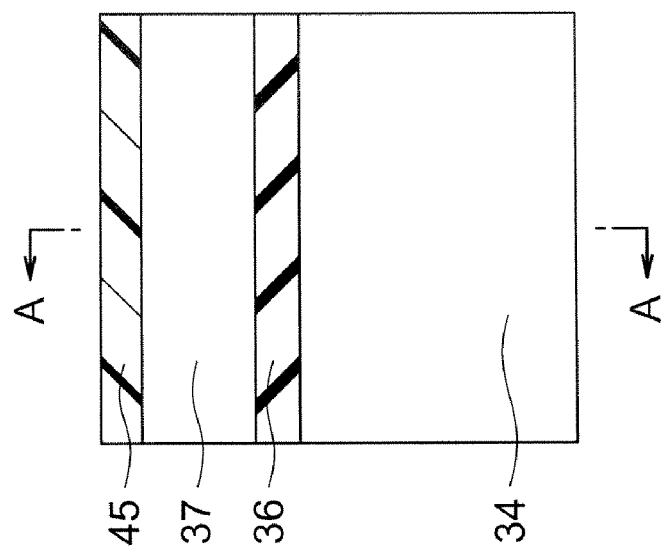

Next, a semiconductor device in accordance with a fourth embodiment of the present invention is described. The semiconductor device of this embodiment is a stacked memory that includes memory cells. Referring to FIGS. 28A and 28B, the memory cells are described.

FIGS. 28A and 28B are cross-sectional views of stack-type memory cells of the fourth embodiment, taken along the word lines and a plane perpendicular to the word lines, respectively. As shown in FIGS. 28A and 28B, each memory cell in this embodiment has a gate stack structure (hereinafter referred to also as a memory gate stack) in which a tunnel insulating film 36, a floating gate electrode 37, an interelectrode insulating film 38, an impurity segregation layer 44, and a control gate electrode 40 are stacked in this order on a semiconductor substrate 34. The interelectrode insulating film 38 includes an insulating film 38a that is formed on the floating gate electrode 37 and is made of a high-k material, and a control gate interface insulating layer 38b that is formed on the insulating film 38a. Sidewall oxide films 41 are provided on the sides of the memory gate stack. The memory gate stack covered with the sidewall oxide films 41 is further covered with an interlayer insulating film 42. Source/drain diffusion layers 35 are formed at the portions of the semiconductor substrate 34 on both sides of the memory gate stack. The individual stack-type memory cells are isolated from one another by device isolation insulating films 43.

In this embodiment, each control gate electrode 40 is formed with a metal silicide containing Ni or the like. Accordingly, each stack-type memory cell of this embodiment can avoid the problem of a decrease in control gate voltage in the depletion region in the Si gate, which is normally caused in a conventional memory cell. Thus, writing/erasing operations can be effectively performed, and the window of the threshold voltage Vth becomes larger to increase the memory capacity. Also, the interelectrode insulating film 38 includes the insulating film 38a made of a high-k material and the control gate interface insulating layer 38b formed with a silicon oxynitride film or a silicon nitride film. Accordingly, when a high voltage for writing/erasing is applied to the control gate electrode 40, the leakage current can be restricted to a small amount, while the strong capacitance coupling between the control gate electrode 40 and the floating gate electrode 37 is maintained. Thus, writing/erasing operations can be more effectively performed than in conventional cases.

This embodiment is characterized in that a SiON or SiN film is provided at the interface between the insulating film 38a made of a high-k material and the control gate electrode 40 formed with a metal silicide. With this structure, the problem of a decrease in the work function of the metal silicide described can be solved. Generally, as the work function of the control gate electrode 40 becomes larger, the leakage current between the control gate electrode 40 and the floating gate electrode 37 becomes smaller. This is because the electron barrier between the control gate electrode 40 and the interelectrode insulating film 38 becomes higher, and hinders the electron transport in the interelectrode insulating film 38. In accordance with this embodiment, a memory gate stack that includes the interelectrode insulating film 38 containing the insulating film 38a made of a high-k material and the control gate electrode 40 formed with a metal silicide having a large work function can be formed. Accordingly, the capacitance coupling between the floating gate electrode 37 and the control gate electrode 40 can be increased, while the leakage current is restrained. The metal silicide of the control gate electrode 40 may contain Co or Ni.

In this embodiment, the impurity segregation layer 44 containing boron is provided at the interface between the control gate electrode 40 and the control gate interface insulating layer 38b, so as to further increase the work function of the metal silicide. With this arrangement, the leakage current between the control gate electrode 40 and the floating gate electrode 37 becomes even lower. As in the first embodiment, in the bonding state of the impurities contained in the impurity segregation layer 44, the total number of metallic bonds mostly located on the side of the control gate electrode 40 is characteristically larger than the total number of each of oxidized, nitrided, or oxynitrided bonds mostly located on the side of the control gate interface insulating layer 38b. With this arrangement, the work function of the control gate electrode 40 can be increased by virtue of a 13-group element such as boron, even over the control gate interface insulating layer 38b formed with a SiON or a SiN film.

Next, a method for manufacturing the semiconductor device in accordance with the fourth embodiment is described.

FIGS. 29A through 37B illustrate the procedures for manufacturing the semiconductor device in accordance with the fourth embodiment.

First, a thermally-oxidized $SiO_2$ film of 10 nm in film thickness is formed as the tunnel insulating film 36 on the semiconductor substrate 34 to which desired impurities are added. A polycrystalline silicon layer of 100 nm in thickness is deposited as the floating gate electrode 37 by CVD or the like. The polycrystalline silicon layer 37 is n-type doped with impurities such as phosphorus. A mask material 45 for device isolation is deposited on the entire surface of the floating gate electrode 37. With the use of a device isolation resist pattern (not shown), etching is performed on the mask material 45, the floating gate electrode 37, and the tunnel insulating film 36 by RIE (Reactive Ion Etching) or the like. The semiconductor substrate 34 is further processed to form device isolation grooves 46 of 150 nm in depth. In this manner, the structure shown in FIGS. 29A and 29B is obtained.

The device isolation insulating film 43 is then deposited on the entire surface of the structure shown in FIGS. 29A and 29B. Here, a silicon oxide film is deposited by CVD. The portions of the silicon oxide film existing on the upper surface of the structure is removed by a flattening technique such as CMP, and the surface of the structure is flattened to obtain the structure shown in FIGS. 30A and 30B. At this point, the mask materials 45 are exposed.

Figure 31B:
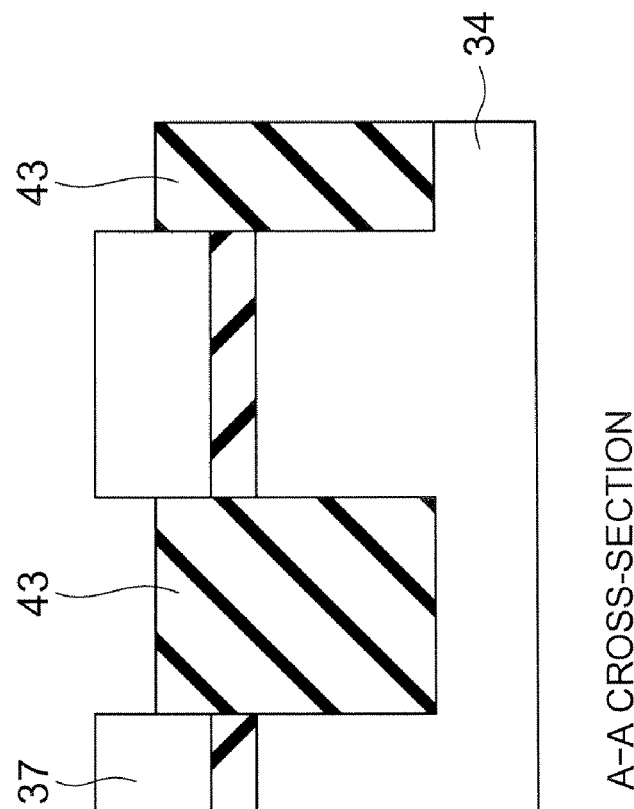
Figure 31A:
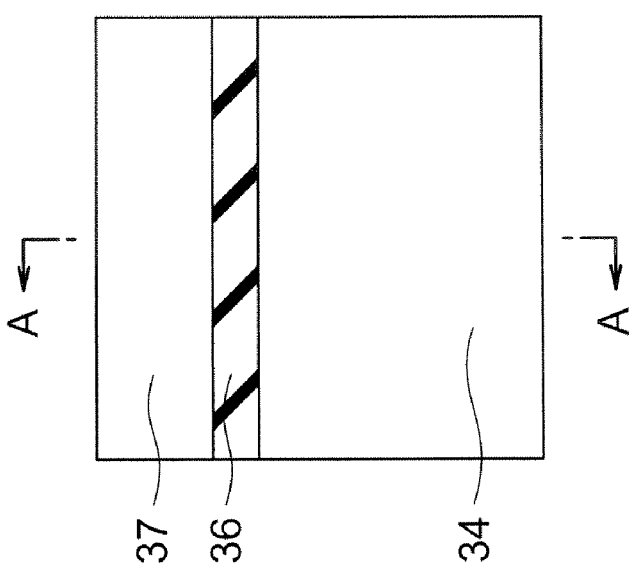

The exposed mask materials 45 are selectively removed, and etching is performed on the device isolation insulating films 43, so as to expose the side faces of the floating gate electrodes 37. In this embodiment, etching with a diluted HF solution is performed on the silicon oxide film, so as to form protrusions of the floating gate electrodes 37 of 50 nm in height. FIGS. 31A and 31B show the structure obtained in this manner.

The insulating film 38a made of a high-k material and the insulating film 38b made of SiON or SiN are deposited as the interelectrode insulating film 38 on the entire surface of the structure shown in FIGS. 31A and 31B. The insulating film 38a may be formed with hafnium silicate, nitrogen-added hafnium silicate, hafnium aluminate (HfAlO), zirconium silicate, nitrogen-added zirconium silicate, alumina, hafnia, lanthanum aluminate, or the like. Particularly, a high-k film containing Hf has a high heat resistance and a high dielectric constant, and accordingly, is desirable as a high-k material in this embodiment. In this embodiment, a HfAlO film 38a of 15 nm in film thickness is deposited by ALD. At this point, an interface transition layer of 1 nm or smaller in film thickness might be formed between the floating gate electrode 37 and the high-k film 38a. Meanwhile, the insulating layer 38b preferably has a film thickness in the range of 0.1 nm to 2 nm in terms of $SiO_2$. In this embodiment, a silicon oxynitride layer 38b of 1 nm in $SiO_2$ film thickness and 1.5 nm in physical thickness is deposited also by ALD. The nitrogen concentration in the silicon oxynitride layer 38b is preferably in the range of 3 atomic % to 15 atomic %, so as to form a film with fewer defects. In this manner, the structure shown in FIGS. 32A and 32B is formed.

Figure 32B:
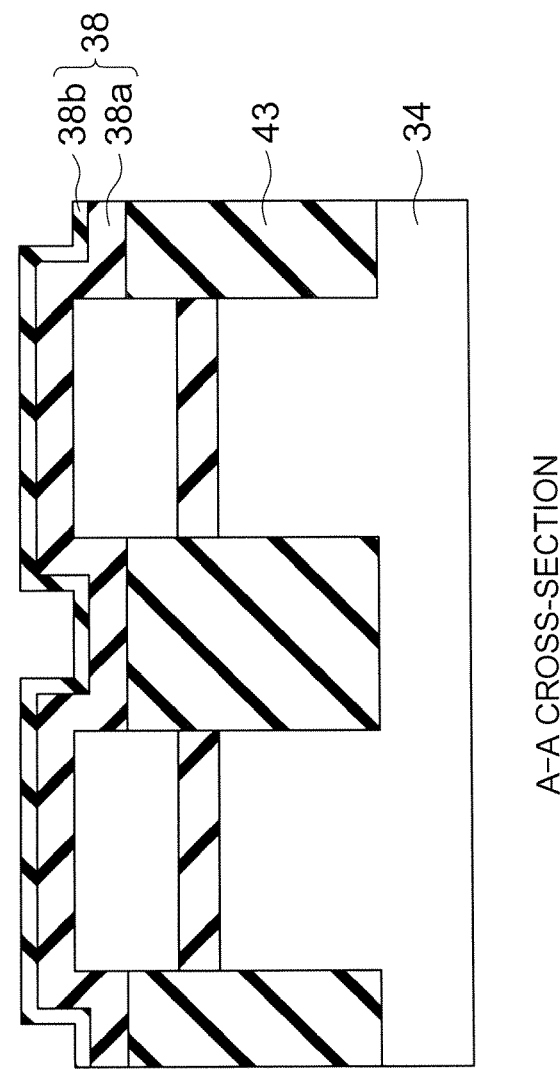
Figure 32A:
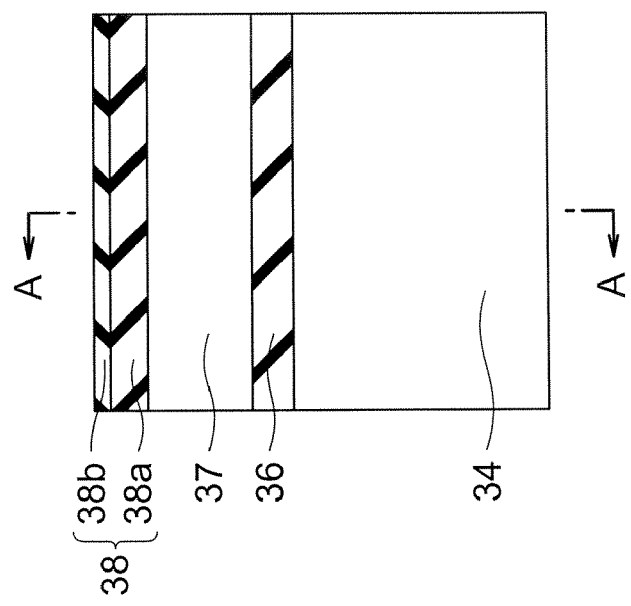
Figure 33B:
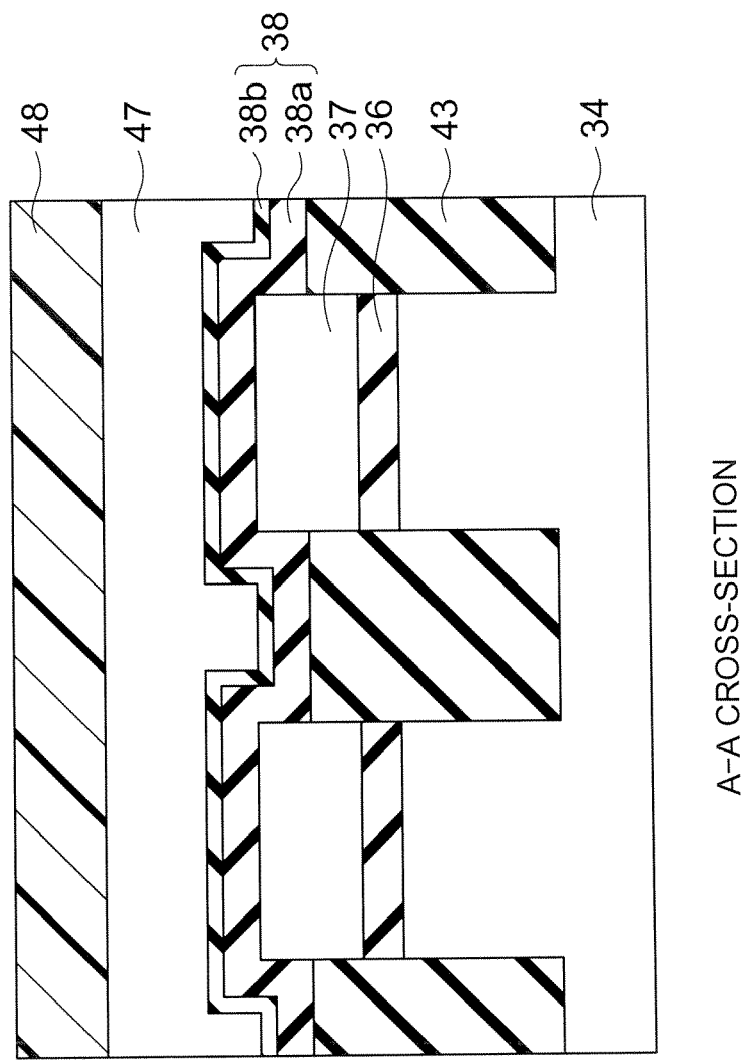
Figure 33A:
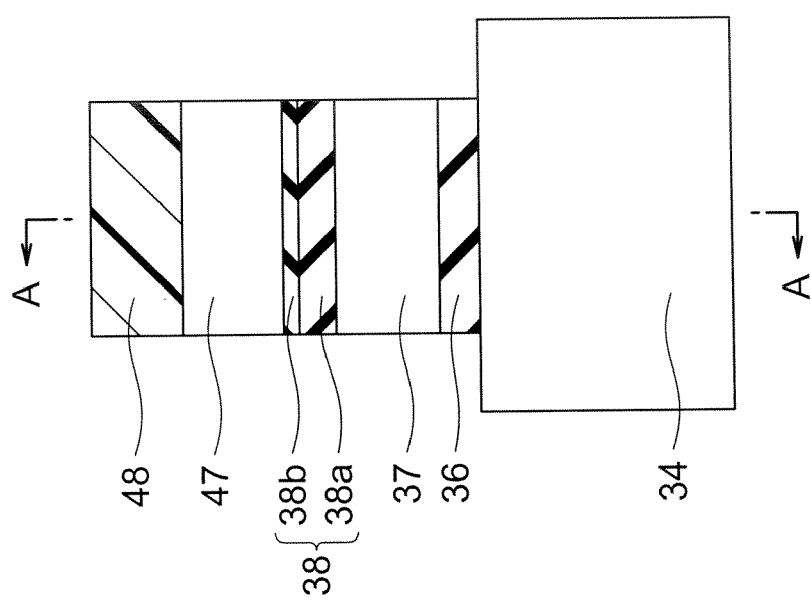
Figure 34B:
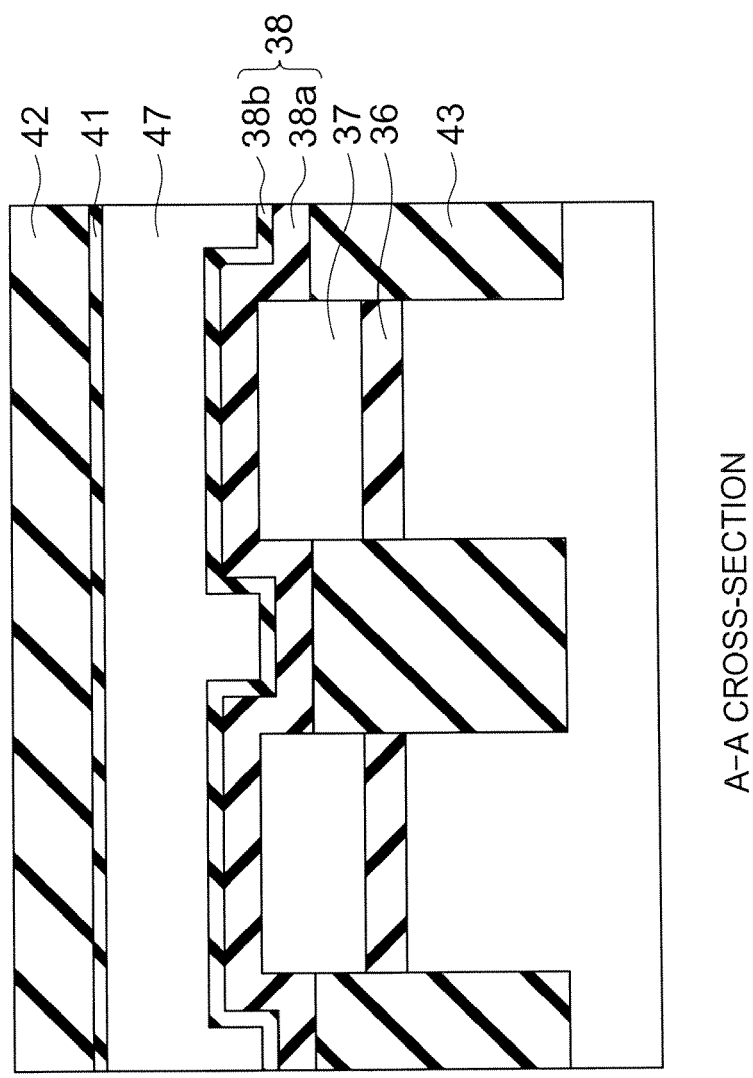
Figure 34A:
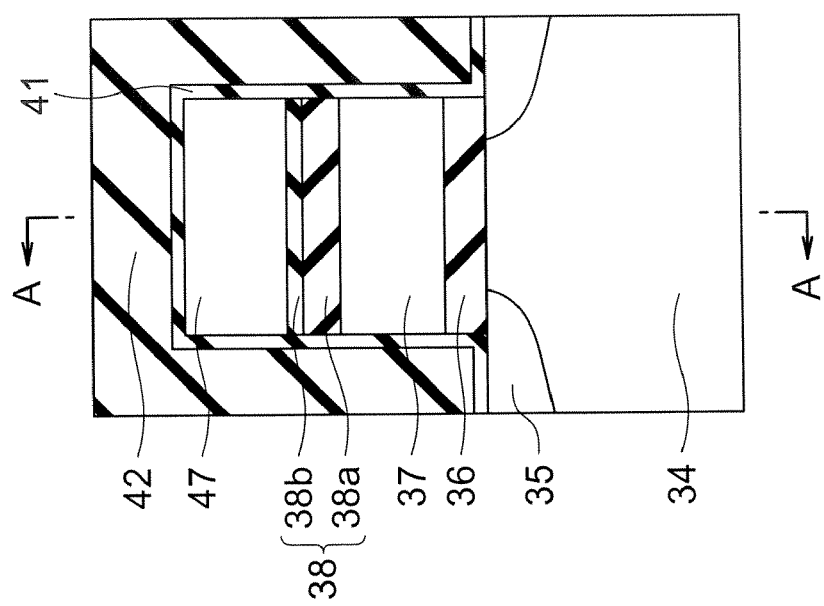

The polycrystalline silicon layer 47 to be the control gate electrodes is then deposited by CVD on the entire surface of the structure shown in FIGS. 32A and 32B. The film thickness of the polycrystalline silicon layer 47 in this embodiment is 100 nm. The mask material 48 is then deposited by RIE on the entire surface of the polycrystalline silicon layer 47, and a gate resist pattern (not shown) is formed on the mask material 48. Etching is then performed on the mask material 48, the polycrystalline silicon layer 47, the silicon oxynitride layer 38b, the insulating film 38a made of a high-k material, the floating gate electrode, and the tunnel insulating film 36 in this order. In this procedure, the shapes of the floating gate electrodes 37 and the control gate electrodes 40 are determined. FIGS. 33A and 33B show sections of the structure obtained here.

Ion implantation for the source/drain region formation is then performed on the structure shown in FIGS. 33A and 33B. After that, the mask material 48 is removed, and the sidewall oxide film 41 of 2 nm is formed on the exposed faces of the memory gate stacks by thermal oxidation, for example. An activation heat treatment is then carried out to form the source/drain regions 35. The entire structure is then covered with the interlayer insulating film 42, to obtain the structure shown in FIGS. 34A and 34B.

A procedure for siliciding the control gate electrodes is then carried out. First, a flattening process such as CMP is carried out for the structure shown in FIGS. 34A and 34B, and the portions of the interlayer insulating film 42 and the sidewall oxide film 41 formed on the polycrystalline silicon layer 47 are removed to expose the polycrystalline silicon layer 47. The structure formed at this point is shown in FIGS. 35A and 35B.

Figure 35B:
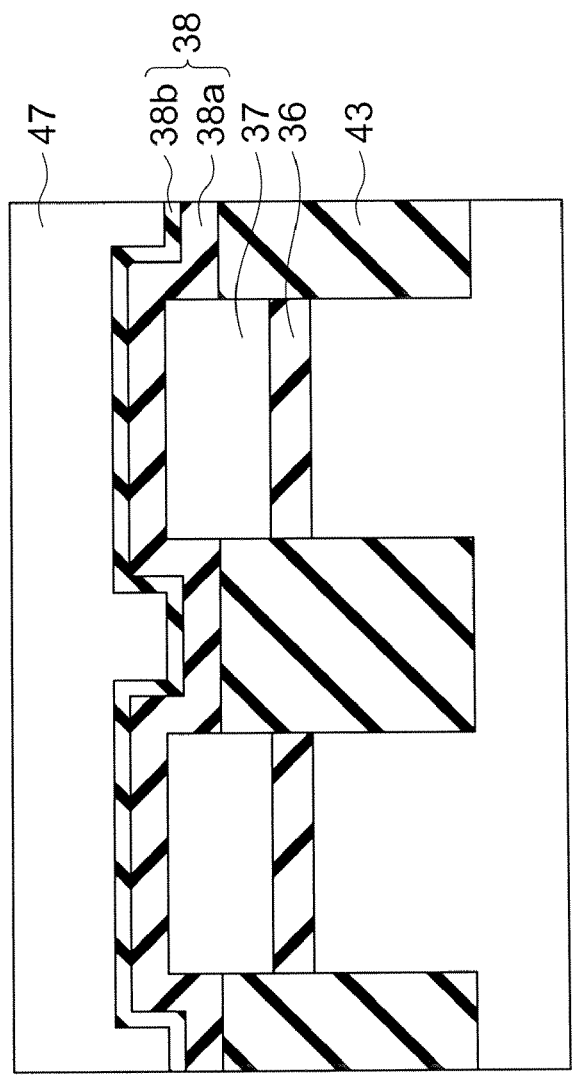
Figure 35A:
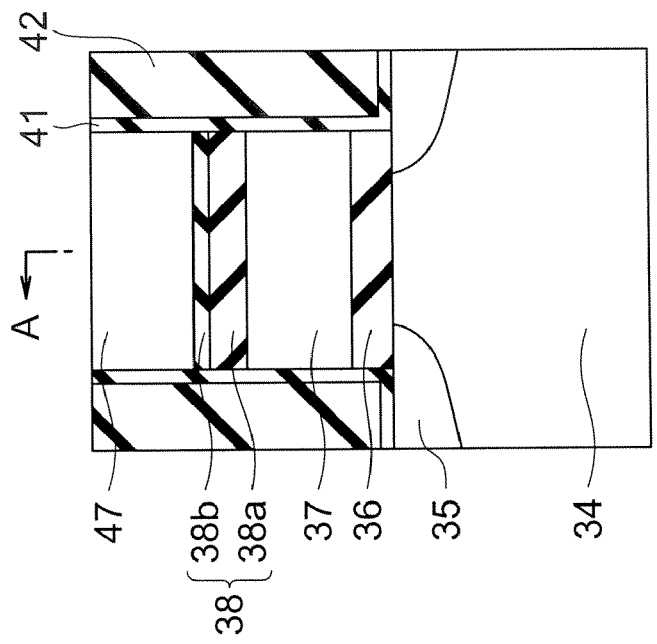

A metal layer 49 that is made of Ni and has a film thickness of 70 nm is deposited by a sputtering technique on the entire surface of the structure shown in FIGS. 35A and 35B (see FIGS. 36A and 36B). Here, the metal layer 49 may be formed with a silicide that is made of either Ni or Co and has a metal-to-silicon (metal/silicon) composition ratio in the range of 0.5 to 2. The work function of any of such metal silicide phases is in the range of 4.55 eV to 4.75 eV. Accordingly, silicide electrodes having relatively large work functions can be formed. The metal silicide phases can be controlled by adjusting the film thickness ratio of metal to silicon. Alternatively, a silicide may be formed with Pt, Ir, Ru, Pd, or Re, or a silicide having a metal-to-silicon (metal/silicon) composition ratio of 2 or higher may be formed with Ni or Co, so as to achieve work functions in the range of 4.75 eV to 5.10 eV. Such cases have a drawback that the thermal stability is poorer than that of a metal silicide having a work function in the range of 4.55 eV to 4.75 eV, though leakage current can be reduced.

Figure 37B:
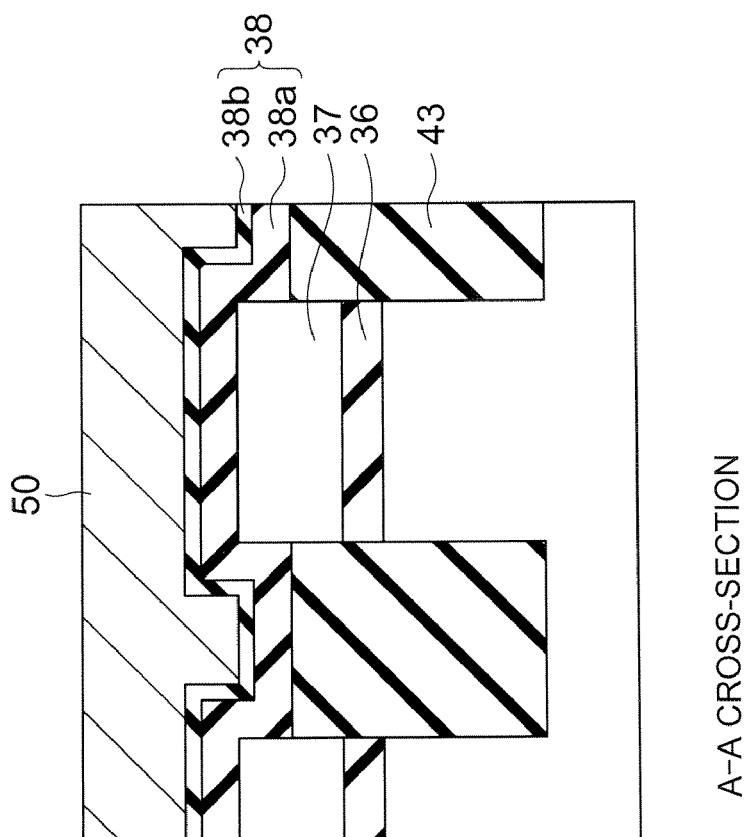
Figure 37A:
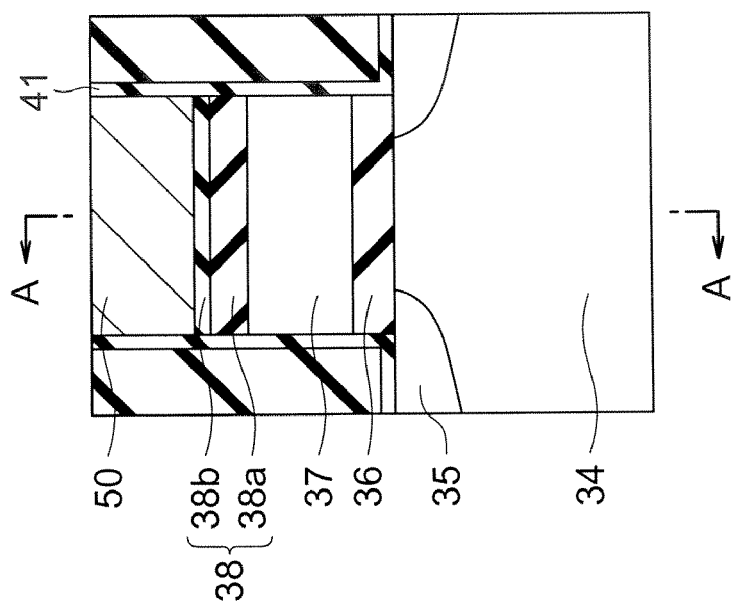

A heat treatment is then carried out at 450° C. for one minute, so as to thoroughly silicide the polycrystalline silicon layer 47. The unreacted Ni is selectively removed with a sulfuric acid solution. Thus, the structure shown in FIGS. 37A and 37B is formed. Since impurities are not added to the polycrystalline silicon layer 47, an impurity segregation layer is not yet formed at the interfaces between the metal silicide 50 and the insulating layers 38b.

Ion implantation with a 13-group element is then performed on the entire structure shown in FIGS. 37A and 37B. Here, boron is implanted with an acceleration energy of 5 keV and a dose amount of $5\times10^{15}/cm^2$. At least part of the boron implanted into the metal silicide 50 to be the control gate electrodes 40 is then thermally diffused, so that the boron is segregated at the interfaces of the metal silicide 50 and the control gate interface insulating layers 38b. In this embodiment, a heat treatment is carried out at 450° C. for one minute, so as to form an interface impurity segregation layer 44 at the interface between the control gate electrodes 40 and the control gate interface insulating layers 38b. In this impurity segregation layer 44 formed in this manner, the total number of metallic bonds of impurities segregated on the side of the control gate electrodes 40 is larger than the total number of each of oxidized, nitrided, or oxynitrided bonds of impurities segregated on the side of the control gate interface insulating layers 38b. Accordingly, the work functions can be made larger. After that, the interlayer insulating film 42 is again formed, and the structure shown in FIGS. 28A and 28B is completed.

In this embodiment, the effective work function is 4.85 eV by virtue of the modulation effect of boron, while NiSi has a work function of 4.65 eV. Accordingly, the leakage current between the electrodes at the time of writing or erasing can be dramatically reduced, and the Vth window of each stack-type memory cell can be made larger.

This embodiment also effectively reduces the capacitance coupling and the leakage current between the electrodes, since the interelectrode insulating film is formed with a high-k material. Furthermore, the control gate electrodes 40 are silicided in this embodiment, so as to avoid adverse influence of a voltage decrease caused by a depletion layer that is observed in the conventional case with polygates.

As described above, in accordance with the fourth embodiment, a semiconductor device having metal electrodes that are formed on insulating films made of a material with a higher dielectric constant than $SiO_2$ and have the desired work functions can be obtained.

This embodiment is also applicable to the stacked memory cell of metal/oxide/charge-trapping layer/oxide/semiconductor. Increase in the work function of the metal oxide interface results in improvement of write/erase operation.

The composition ratios and the work functions of the Ni silicides used in the first through fourth embodiments are shown in FIG. 38.

As described above, in accordance with each of the embodiments of the present invention, a semiconductor device having metal electrodes that are formed on insulating films made of a material with a higher dielectric constant than $SiO_2$ and have the desired work functions can be obtained.

Although the embodiments of the present invention have been described so far, the present invention is not limited to them, and various changes may be made to them within the scope of the claimed invention. Also, the present invention may be modified in various ways without departing from the scope of the invention. Further, various modifications of the present invention may be made through combinations of the components disclosed in the above embodiments.

What is claimed is:
1. A semiconductor device comprising:
a substrate;
a p-channel MIS transistor that includes; an n-type semiconductor layer formed on the substrate; first source/drain regions being formed in the n-type semiconductor layer and being separated from each other; a first gate insulating film being formed on the n-type semiconductor layer between the first source/drain regions, and containing silicon, oxygen, and nitrogen, or containing silicon and nitrogen; a first gate electrode formed above the first gate insulating film; and a first interfacial layer being formed at an interface between the first gate insulating film and the first gate electrode, and having a first sub-layer provided in the first gate insulating film and a second sub-layer provided in the first gate electrode, each of the first and second sub-layers containing a 13-group element, the total number of metallic bonds in the 13-group element in the interfacial layer being larger than the total number of each of oxidized, nitrided, or oxynitrided bonds in the 13-group element in the interfacial layer; and an n-channel MIS transistor that includes: a p-type semiconductor layer formed on the substrate; second source/drain regions being formed in the p-type semiconductor layer and being separated from each other; a second gate insulating film being formed on the p-type semiconductor layer between the second source/drain regions, and containing silicon, oxygen, and nitrogen, or containing silicon and nitrogen; a second gate electrode formed above the second gate insulating film; and a second interfacial layer being formed at an interface between the second gate insulating film and the second gate electrode, and containing a 15-group element.

2. The semiconductor device according to claim 1, wherein:
the oxidized, nitrided, or oxynitrided bonds in the 13-group element in the first interfacial layer are mostly located in the first sub-layer; and
the metallic bonds are mostly located in the second sub-layer.

3. The semiconductor device according to claim 1, wherein the 13-group element in the first interfacial layer is boron.

4. The semiconductor device according to claim 1, wherein:
the first and second gate electrodes are formed with materials having the same work functions; and
the work functions are in the range of 4.55 eV to 4.75 eV.

5. The semiconductor device according to claim 4, wherein the first and second gate electrodes are formed with metal silicides containing at least one metal of Ni and Co.

6. The semiconductor device according to claim 1, wherein:
the first gate electrode is formed with a material having a work function in the range of 4.75 eV or more to 5.10 eV or less; and
the second gate electrode is formed with a material having a work function in the range of 4.20 eV or more to 4.55 eV or less.

7. The semiconductor device according to claim 6, wherein:
the first gate electrode is formed with a first metal silicide containing at least one metal of Ni and Co;
the first metal silicide has a metal-to-silicon composition ratio of 2 or higher;
the second gate electrode is formed with a second metal silicide containing the same metal as the first gate electrode; and
the second metal silicide has a metal-to-silicon composition ratio of 1 or lower.

8. The semiconductor device according to claim 6, wherein:
the first gate electrode is formed with a first metal silicide containing at least one metal of Ni, Co, Pt, Ir, Ru, Pd, and Re; and
the second gate electrode is formed with a second metal silicide containing at least one metal of Ni, W, Ti, Zr, Hf, Ta, Nb, and Er.

9. The semiconductor device according to claim 1, further comprising:
a first high-dielectric insulating layer being formed between the n-type semiconductor layer and the first gate insulating layer and containing at least one of a metal oxide, a metal silicon oxide, and a metal silicon oxynitride; and
a second high-dielectric insulating layer being formed between the p-type semiconductor layer and the second gate insulating layer and containing the same material as the first high-dielectric insulating layer.

10. The semiconductor device according to claim 9, wherein the first and second high-dielectric insulating layers contain HfSiON.

* * * * *